(12) United States Patent
Jeong et al.

(10) Patent No.: US 12,154,637 B2
(45) Date of Patent: Nov. 26, 2024

(54) STAGE CIRCUIT

(71) Applicant: Samsung Display Co., LTD., Yongin-si (KR)

(72) Inventors: Il Hun Jeong, Yongin-si (KR); Hai Jung In, Yongin-si (KR); Hye Sung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/380,800

(22) Filed: Oct. 17, 2023

(65) Prior Publication Data

US 2024/0177789 A1 May 30, 2024

(30) Foreign Application Priority Data

Nov. 30, 2022 (KR) .................. 10-2022-1064282

(51) Int. Cl.
*G11C 19/18* (2006.01)
*G09G 3/30* (2006.01)

(52) U.S. Cl.
CPC ............ *G11C 19/184* (2013.01); *G09G 3/30* (2013.01); *G09G 2310/0267* (2013.01); *G09G 2310/0275* (2013.01); *G09G 2310/0286* (2013.01); *G09G 2310/08* (2013.01)

(58) Field of Classification Search
CPC ............. G09G 3/30; G09G 2310/0267; G09G 2310/0275; G09G 2310/0286; G09G 2310/08; G11C 19/184
See application file for complete search history.

(56) References Cited

U.S. PATENT DOCUMENTS

| 10,453,386 | B2 | 10/2019 | Jang |
| 11,443,674 | B2 | 9/2022 | Hong et al. |
| 11,521,570 | B2 | 12/2022 | Lim et al. |
| 11,869,406 | B1* | 1/2024 | In .................. G09G 3/3266 |
| 11,984,058 | B2* | 5/2024 | In .................. G09G 3/2092 |
| 2023/0326388 | A1* | 10/2023 | In .................. G09G 3/2092 |

FOREIGN PATENT DOCUMENTS

| KR | 1020200143618 A | 12/2020 |
| KR | 1020220037660 A | 3/2022 |
| KR | 1020220087742 A | 6/2022 |

* cited by examiner

*Primary Examiner* — Michael Pervan
(74) *Attorney, Agent, or Firm* — CANTOR COLBURN LLP

(57) ABSTRACT

A stage circuit includes an input unit connected to a first input terminal receiving a gate start pulse or a previous stage carry signal to control a voltage of a first node, a first output unit connected to a fourth input terminal to which a clock signal is input and supplying a scan signal to a first output terminal corresponding to a voltage of the first node and a second node, a second output unit connected to a third input terminal to which a second carry clock signal is input and supplying a carry signal to a second output terminal corresponding to the voltage of the first node and the second node, a first control unit connected to a first power input terminal to which first power is input and controlling a voltage of a third node, and a second control unit connected to a second power input terminal.

25 Claims, 13 Drawing Sheets

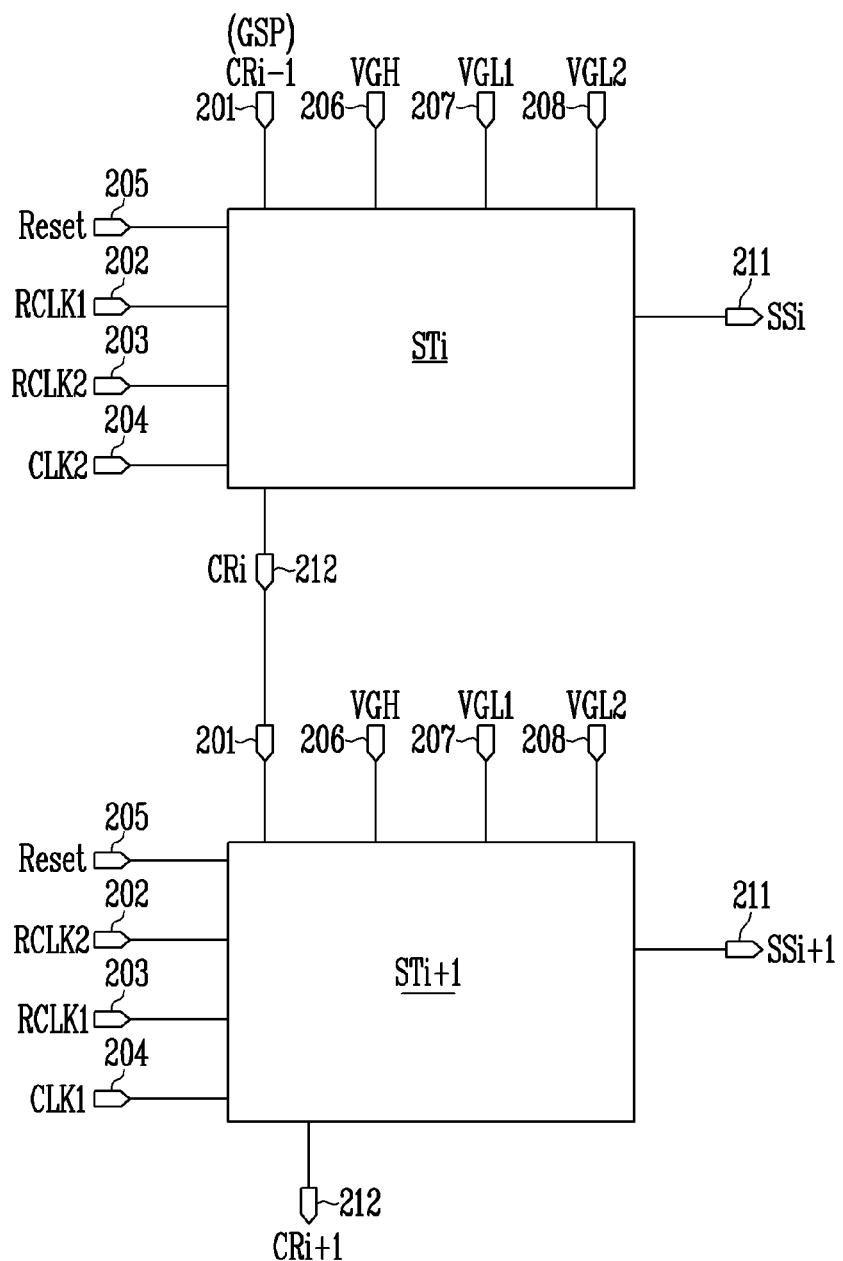

STAGE CIRCUIT

This application claims priority to Korean Patent Application No. 10-2022-0164282, filed on Nov. 30, 2022, and all the benefits accruing therefrom under 35 U.S.C. § 119, the content of which in its entirety is herein incorporated by reference.

BACKGROUND

1. Field

The disclosure relates to a stage circuit.

2. Description of the Related Art

A display device includes a data driver for supplying a data signal to data lines, a scan driver for supplying a scan signal to scan lines, an emission driver for supplying an emission control signal to an emission control line, and pixels positioned to be respectively connected to corresponding data lines of the data lines, corresponding scan lines of the scan lines, and corresponding emission control lines of the emission control lines.

The scan driver includes a stage that generates the scan signal. The stage may include a plurality of transistors and capacitors, and may generate an output signal in which an input signal is shifted based on a plurality of clock signals.

SUMMARY

A feature of the disclosure is to provide a stage circuit configured of an N-type transistor and capable of securing reliability.

Another feature of the disclosure is to provide a stage circuit capable of minimizing dead space.

In an embodiment of the disclosure, a stage circuit includes an input unit connected to a first input terminal receiving a gate start pulse or a previous stage carry signal to control a voltage of a first node, a first output unit which is connected to a fourth input terminal to which a clock signal is input and supplies a scan signal to a first output terminal corresponding to a voltage of the first node and a second node, a second output unit which is connected to a third input terminal to which a second carry clock signal is input and supplies a carry signal to a second output terminal corresponding to the voltage of the first node and the second node, a first control unit which is connected to a first power input terminal to which first power is input and controls a voltage of a third node, a second control unit which is connected to a second power input terminal to which second power is input and controls the voltage of the third node, and a first driving unit which controls an electrical connection between the second node and the first power input terminal in response to the voltage of the third node. The first driving unit cuts off the electrical connection between the second node and the first power input terminal when a voltage of the second power is supplied to the third node by the second control unit, and electrically connects the second node and the first power input terminal when a voltage of the first power is supplied to the third node.

In an embodiment, the first driving unit includes an eleventh transistor connected between the first power input terminal and the second node, and including a gate electrode and a back-gate electrode connected to the third node.

In an embodiment, the first control unit includes a tenth transistor connected between the first power input terminal and the third node, and including a gate electrode and a back-gate electrode connected to the first power input terminal.

In an embodiment, the tenth transistor is configured by connecting a plurality of transistors in series.

In an embodiment, the second control unit includes a twelfth transistor connected between the second power input terminal and the third node, and including a gate electrode and a back-gate electrode connected to the first node.

In an embodiment, the stage circuit further includes a second driving unit which is connected to a third power input terminal to which third power is input and controls the voltage of the second node in response to the voltage of the first node, a third driving unit which controls a voltage of the second output terminal in response to the voltage of the second node and the first node, a reset unit which is connected to the first node, the third power input terminal, and a fifth input terminal to which a reset signal is input, and supplies a voltage of the third power to the first node when the reset signal is supplied to the fifth input terminal, and a fourth driving unit which is connected to the input unit and the reset unit via the first power input terminal and a fourth node and controls a voltage of the fourth node in response to the voltage of the first node.

In an embodiment, the input unit is connected to a second input terminal to which a first carry clock signal is input, the input unit includes a (1-1)-th transistor and a (1-2)-th transistor connected in series between the first input terminal and the first node and including a gate electrode connected to the second input terminal, and a common node between the (1-1)-th transistor and the (1-2)-th transistor is connected to the fourth node.

In an embodiment, the input unit includes a (1-1)-th transistor and a (1-2)-th transistor connected in series between the first input terminal and the first node and including a gate electrode connected to the first input terminal, and a common node between the (1-1)-th transistor and the (1-2)-th transistor is connected to the fourth node.

In an embodiment, the second driving unit includes a thirteenth transistor connected between the second node and the third power input terminal, and including a gate electrode and a back-gate electrode connected to the first node.

In an embodiment, the third driving unit includes a fifth transistor connected between the first node and the second output terminal, and including a gate electrode connected to the second node.

In an embodiment, the third driving unit further includes a fourth transistor connected between the fifth transistor and the first node, and including a gate electrode connected to the third input terminal.

In an embodiment, the fourth driving unit includes a plurality of third transistors connected in series between the first power input terminal and the fourth node, and including a gate electrode and a back-gate electrode connected to the first node.

In an embodiment, the reset unit includes a (2-1)-th transistor and a (2-2)-th transistor connected in series between the first node and the third power input terminal, a gate electrode of the (2-1)-th transistor and the (2-2)-th transistor is connected to the fifth input terminal, and a common node between the (2-1)-th transistor and the (2-2)-th transistor is connected to the fourth node.

In an embodiment, the (2-1)-th transistor and the (2-2)-th transistor further include a back-gate electrode, and the back-gate electrode is connected to the fifth input terminal.

In an embodiment, the (2-2)-th transistor further includes a back-gate electrode, and the back-gate electrode is connected to the third power input terminal.

In an embodiment, the stage circuit further includes a fifth driving unit which controls an electrical connection between the second node and the third power input terminal in response to a carry signal of a next stage circuit supplied to a second input terminal.

In an embodiment, the fifth driving unit includes a (14-1)-th transistor and a (14-2)-th transistor connected between the second node and the third power input terminal and including a gate electrode connected to the second input terminal, and a common node between the (14-1)-th transistor and the (14-2)-th transistor is connected to the fourth node.

In an embodiment, the first power is set to a voltage value higher than that of the second power and the third power, and the second power and the third power are set to a same voltage value.

In an embodiment, the first power is set to a voltage value higher than that of the second power and the third power, and the second power is set to a voltage value higher than that of the third power.

In an embodiment, the stage circuit further includes a first capacitor connected between the first node and the second output terminal.

In an embodiment, the stage circuit further includes a second capacitor connected between the second node and the third node.

In an embodiment, the first output unit includes an eighth transistor connected between the fourth input terminal and the first output terminal, and including a gate electrode and a back-gate electrode connected to the first node, and a ninth transistor connected between the first output terminal and the second power input terminal, and including a gate electrode connected to the second node.

In an embodiment, the ninth transistor includes a back-gate electrode connected to the second power input terminal.

In an embodiment, the second output unit includes a sixth transistor connected between the third input terminal and the second output terminal, and including a gate electrode and a back-gate electrode connected to the first node, and a seventh transistor connected between the second output terminal and the third power input terminal, and including a gate electrode connected to the second node.

In an embodiment, the seventh transistor includes a back-gate electrode connected to the third power input terminal.

Objects of the disclosure are not limited to the objects described above, and other technical objects which are not described will be clearly understood by those skilled in the art from the following description.

The stage circuit in embodiments of the disclosure uses a gate sync transistor in a place where relatively high mobility is desired, and uses a source sync transistor and/or a single gate transistor in a place where reliability is desired. In this case, reliability may be secured while minimizing dead space.

However, an effect of the disclosure is not limited to the above-described effect, and may be variously expanded within a range without departing from the spirit and scope of the disclosure.

BRIEF DESCRIPTION OF THE DRAWINGS

The above and other features of the disclosure will become more apparent by describing in further detail embodiments thereof with reference to the accompanying drawings, in which:

FIG. 3 is a diagram illustrating an embodiment of a stage connection terminal shown in FIG. 2;

DETAILED DESCRIPTION OF THE EMBODIMENT

Figure 1:
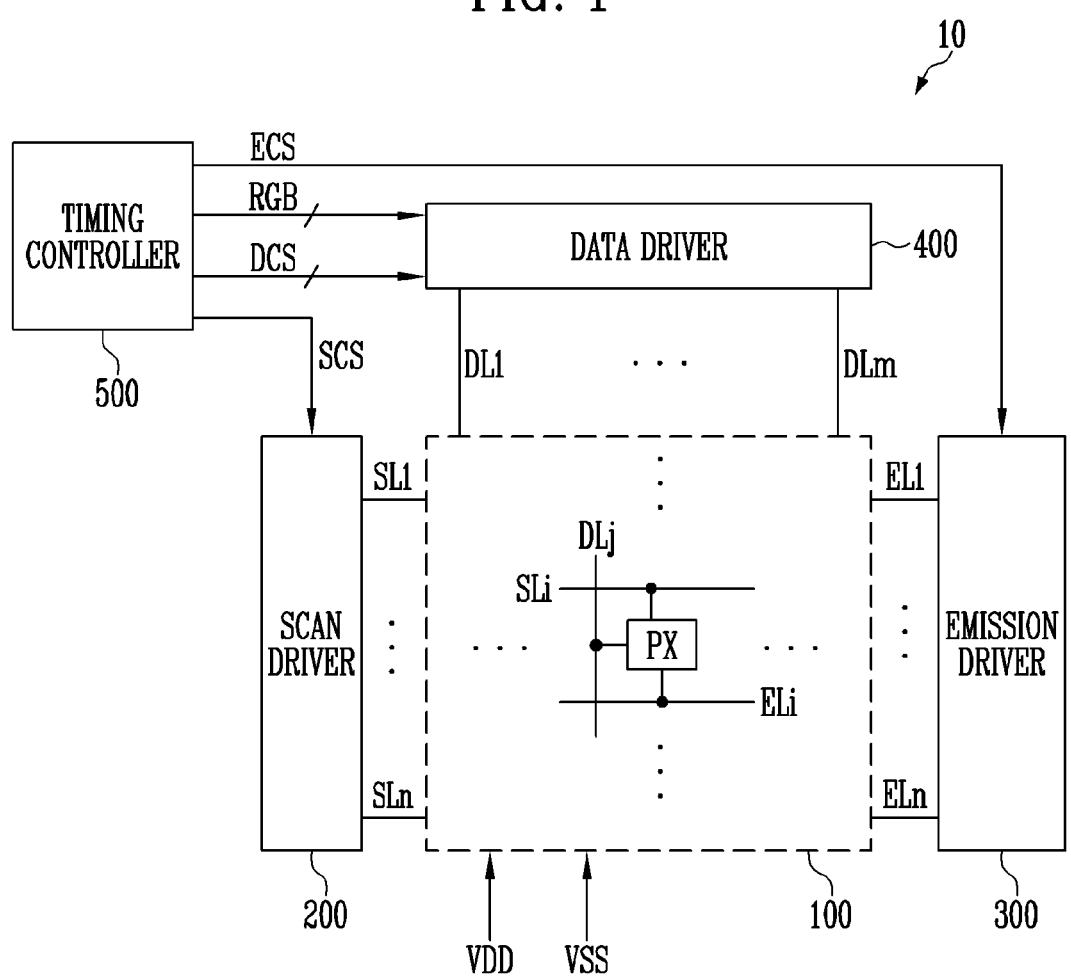
FIG. 1 is a diagram illustrating an embodiment of a display device according to the disclosure.

Hereinafter, various embodiments of the disclosure will be described in detail with reference to the accompanying drawings so that those skilled in the art may easily carry out the disclosure. The disclosure may be implemented in various different forms and is not limited to the embodiments described herein.

In order to clearly describe the disclosure, parts that are not related to the description are omitted, and the same or similar elements are denoted by the same reference numerals throughout the specification. Therefore, the above-described reference numerals may be used in other drawings.

In addition, sizes and thicknesses of each component shown in the drawings are arbitrarily shown for convenience of description, and thus the disclosure is not necessarily limited to those shown in the drawings. In the drawings, thicknesses may be exaggerated to clearly express various layers and areas.

In addition, an expression "is the same" in the description may mean "is substantially the same". That is, the expression "is the same" may be the same enough for those of ordinary skill to understand that it is the same. Other expressions may also be expressions in which "substantially" is omitted.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within #30%, 20%, 10%, 5% of the stated value, for example.

The term "part" or "unit" as used herein is intended to mean a software component or a hardware component that performs a predetermined function. The hardware component may include a field-programmable gate array ("FPGA")

or an application-specific integrated circuit ("ASIC"), for example. The software component may refer to an executable code and/or data used by the executable code in an addressable storage medium. Thus, the software components may be object-oriented software components, class components, and task components, and may include processes, functions, attributes, procedures, subroutines, segments of program code, drivers, firmware, micro codes, circuits, data, a database, data structures, tables, arrays, or variables, for example.

FIG. 1 is a diagram illustrating an embodiment of a display device according to the disclosure.

Referring to FIG. 1, a display device 10 in an embodiment of the disclosure may include a pixel unit 100, a scan driver 200 (or a first gate driver), an emission driver 300 (or a second gate driver), a data driver 400, and a timing controller 500. Hereinafter, the scan driver 200 and the emission driver 300 may be understood as one configuration of a gate driver.

The pixel unit 100 may display a predetermined image. To this end, the pixel unit 100 may include pixels PX disposed to be connected to data lines DL1 to DLm (m is a natural number), scan lines SL1 to SLn (n is a natural number), and emission control lines EL1 to ELn. The pixels PX may be supplied with voltages of first driving power VDD, second driving power VSS, and initialization power (not shown) from an outside. In an embodiment, the second driving power VSS may be set to a voltage level lower than that of the first driving power VDD. In an embodiment, the first driving power VDD may be set to a positive voltage and the second driving power VSS may be set to a negative voltage, for example.

Additionally, the pixels PX may be connected to one or more scan lines (at least one of SL1 to SLn) and emission control lines (at least one of EL1 to ELn) in correspondence with a structure of a pixel circuit. The pixel PX may include a driving transistor, a plurality of switching transistors implemented as at least one of an N-type transistor and a P-type transistor, and a light-emitting element.

The timing controller 500 may receive an input control signal and an input image signal from an image source such as an external graphic device. The timing controller 500 may generate image data RGB suitable for an operation condition of the pixel unit 100 based on the input image signal and supply the image data RGB to the data driver 400. The timing controller 500 may generate a first control signal SCS for controlling a driving timing of the scan driver 200, a second control signal ECS for controlling a driving timing of the emission driver 300, and a third control signal DCS for controlling a driving timing of the data driver 400, based on the input control signal, and may supply the first control signal SCS, the second control signal ECS, and the third control signal DCS to the scan driver 200, the emission driver 300, and the data driver 400, respectively.

The scan driver 200 may receive the first control signal SCS from the timing controller 500. The scan driver 200 may supply a scan signal to the scan lines SL1 to SLn in response to the first control signal SCS. The first control signal SCS may include a start pulse (or a gate start pulse) and a plurality of clock signals.

In an embodiment, the scan driver 200 may sequentially supply the scan signal to the scan lines SL1 to SLn. Here, the scan signal may be a signal for writing a data signal to the driving transistor, and may be set to a gate-on voltage. In an embodiment, the scan driver 200 may supply at least one scan signal to each of the scan lines SL1 to SLn during one frame period.

The emission driver 300 may receive the second control signal ECS from the timing controller 500. The emission driver 300 may supply an emission control signal to the emission control lines EL1 to ELn in response to the second control signal ECS. The second control signal ECS may include a start pulse and a plurality of clock signals for the emission control signal.

In an embodiment, the emission driver 300 may sequentially supply the emission control signal to the emission control lines EL1 to ELn. Here, the emission control signal may be a signal for non-emission of the pixels PX and may be set to a gate-off voltage. In an embodiment, the emission driver 300 may supply at least one emission control signal to each of the emission control lines EL1 to ELn during one frame period.

The data driver 400 may receive the third control signal DCS from the timing controller 500. The data driver 400 may convert the image data RGB into an analog data signal (e.g., a data voltage) in response to the third control signal DCS and supply the data signal to the data lines DL1 to DLm. In an embodiment, the data driver 400 may supply the data signal to the data lines DL1 to DLm to be synchronized with the scan signal supplied to each of the scan lines SL1 to SLn. The data signal supplied to the data lines DL1 to DLm may be supplied to the pixels PX selected by the scan signal.

In FIG. 1, for convenience of description, each of the scan driver 200 and the emission driver 300 is shown as a single configuration, but an embodiment of the disclosure is not limited thereto. According to design, the scan driver 200 may include a plurality of scan drivers each supplying at least one of scan signals of different waveforms. In addition, at least a portion of the scan driver 200 and the emission driver 300 may be integrated into one driving circuit, module, or the like.

In an embodiment, the display device 10 may further include a power supply (not shown). The power supply may supply the voltage of the first driving power VDD, the voltage of the second driving power VSS, the voltage of the initialization power, or the like to the pixel unit 100 to drive the pixel PX.

Figure 2:
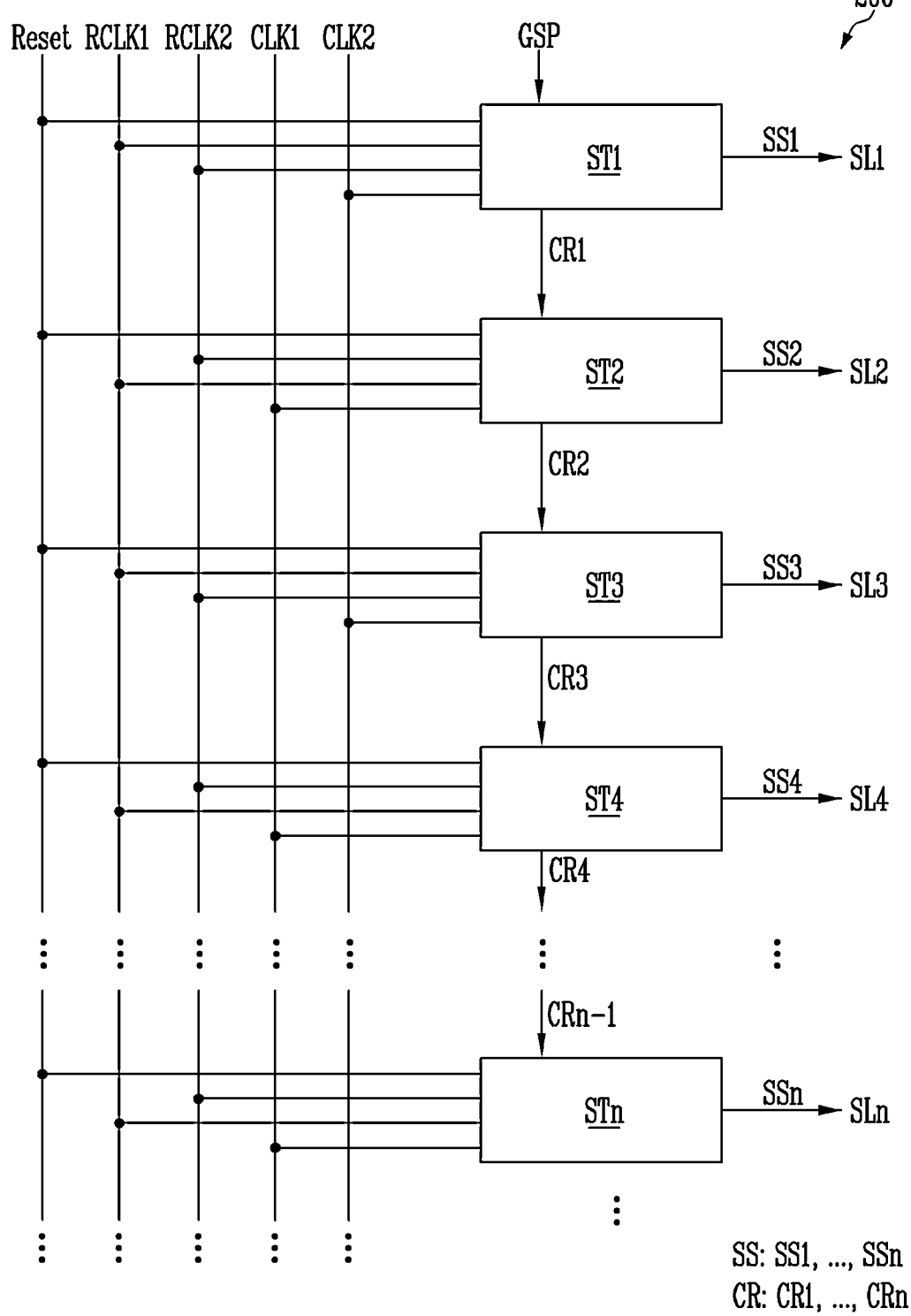
FIG. 2 is a block diagram illustrating an embodiment of a scan driver according to the disclosure.

FIG. 2 is a block diagram illustrating an embodiment of a scan driver according to the disclosure.

Referring to FIG. 2, the scan driver 200 in an embodiment of the disclosure may include a plurality of stages ST1 to STn (or stage circuits). Each of the stages ST1 to STn may be connected to any one of the scan lines SL1 to SLn, and may output scan signals SS and carry signals CR in response to clock signals CLK1 and CLK2 and carry clock signals RCLK1 and RCLK2. In an embodiment, an i-th stage STi (shown in FIG. 3) may supply a scan signal SSi to an i-th scan line SLi (i is a natural number), for example.

A first stage ST1 may supply a first scan signal SS1 to a first scan line SL1 in response to a gate start pulse GSP, a first carry clock signal RCLK1, a second carry clock signal RCLK2, and a second clock signal CLK2.

A second stage ST2 may supply a second scan signal SS2 to a second scan line SL2 in response to a first carry signal CR1 from the first stage ST1, the second carry clock signal RCLK2, the first carry clock signal RCLK1, and the first clock signal CLK1.

A third stage ST3 may supply a third scan signal SS3 to a third scan line SL3 in response to a second carry signal CR2 from the second stage ST2, the first carry clock signal RCLK1, the second carry clock signal RCLK2, and the second clock signal CLK2.

A fourth stage ST4 may supply a fourth scan signal SS4 to a fourth scan line SL4 in response to a third carry signal CR3 from the third stage ST3, the second carry clock signal RCLK2, the first carry clock signal RCLK1, and the first clock signal CLK1.

In an embodiment, an odd-numbered (or even-numbered) stage may be driven in response to a carry signal CR of a previous stage (or the gate start pulse GSP), the first carry clock signal RCLK1, the second carry clock signal RCLK2, and the second clock signal CLK2, and an even-numbered (or odd-numbered) stage may be driven in response to the carry signal CR of the previous stage, the second carry clock signal RCLK2, the first carry clock signal RCLK1, and the first clock signal CLK1.

In an embodiment, the stages ST1 to STn may receive a reset signal Reset. The reset signal Reset may be supplied when power is applied or for each of a plurality of frame periods. When the reset signal Reset is supplied to the stages ST1 to STn, the stages ST1 to STn may be initialized.

FIG. 3 is a diagram illustrating an embodiment of a stage connection terminal shown in FIG. 2. In FIG. 3, for convenience of description, an i-th stage STi and an (i+1)-th stage STi+1 are shown.

Referring to FIG. 3, each of the stages STi and STi+1 includes a first input terminal 201, a second input terminal 202, a third input terminal 203, a fourth input terminal 204, a fifth input terminal 205, a first power input terminal 206, a second power input terminal 207, a third power input terminal 208, a first output terminal 211, and a second output terminal 212.

The first input terminal 201 may receive the carry signal CR of the previous stage. In an embodiment, an (i−1)-th carry signal CRi−1 may be input to the first input terminal 201 of the i-th stage STi, and an i-th carry signal CRi may be input to the first input terminal 201 of the (i+1)-th stage STi+1, for example. Here, when the i-th stage STi is set to a first stage (i.e., the first stage ST1), the gate start pulse GSP may be input to the first input terminal 201.

The second input terminal 202 of the i-th stage STi may receive the first carry clock signal RCLK1, and the third input terminal 203 may receive the second carry clock signal RCLK2. In addition, the second input terminal 202 of the (i+1)-th stage STi+1 may receive the second carry clock signal RCLK2, and the third input terminal 203 may receive the first carry clock signal RCLK1.

In an embodiment, the first carry clock signal RCLK1 may be supplied to the second input terminal 202 of odd-numbered stages, the second carry clock signal RCLK2 may be supplied to the third input terminal 203 of the odd-numbered stages, the second carry clock signal RCLK2 may be supplied to the second input terminal 202 of even-numbered stages, and the first carry clock signal RCLK1 may be supplied to the third input terminal 203 of the even-numbered stages.

The fourth input terminal 204 of the i-th stage STi may receive the second clock signal CLK2, and the fourth input terminal 204 of the (i+1)-th stage STi+1 may receive the first clock signal CLK1. In an embodiment, the second clock signal CLK2 may be supplied to the fourth input terminal 204 of the odd-numbered stages, and the first clock signal CLK1 may be supplied to the fourth input terminal 204 of the even-numbered stages.

A reset signal Reset is supplied to the fifth input terminal 205 of the stages STi and STi+1. The reset signal Reset may be for initializing the stages STi and STi+1, and may be supplied more than once when power is input. In an embodiment, the reset signal Reset may be supplied for each of a plurality of frame periods.

A voltage of first power VGH may be supplied to the first power input terminal 206 of the stages STi and STi+1, and a voltage of the second power VGL1 may be supplied to the second power input terminal 207. In addition, a voltage of third power VGL2 may be supplied to the third power input terminal 208 of the stages STi and STi+1. Here, the second power VGL1 and the third power VGL2 may be set to a voltage lower than that of the first power VGH.

In addition, the third power VGL2 may be set to a voltage lower than that of the second power VGL1. In an embodiment, when transistors included in the stages STi and STi+1 may be stably turned off, the third power VGL2 may be set to the same voltage as that of the second power VGL1. Additionally, the first power VGH may be set to a gate-on voltage so that the transistors may be turned on, and the second power VGL1 and the third power VGL2 may be set to a gate-off voltage so that the transistors are turned off.

Scan signals SSi and SSi+1 may be output from the first output terminal 211 of the stages STi and STi+1, and carry signals CRi and CRi+1 may be output from the second output terminal 212.

Figure 6:
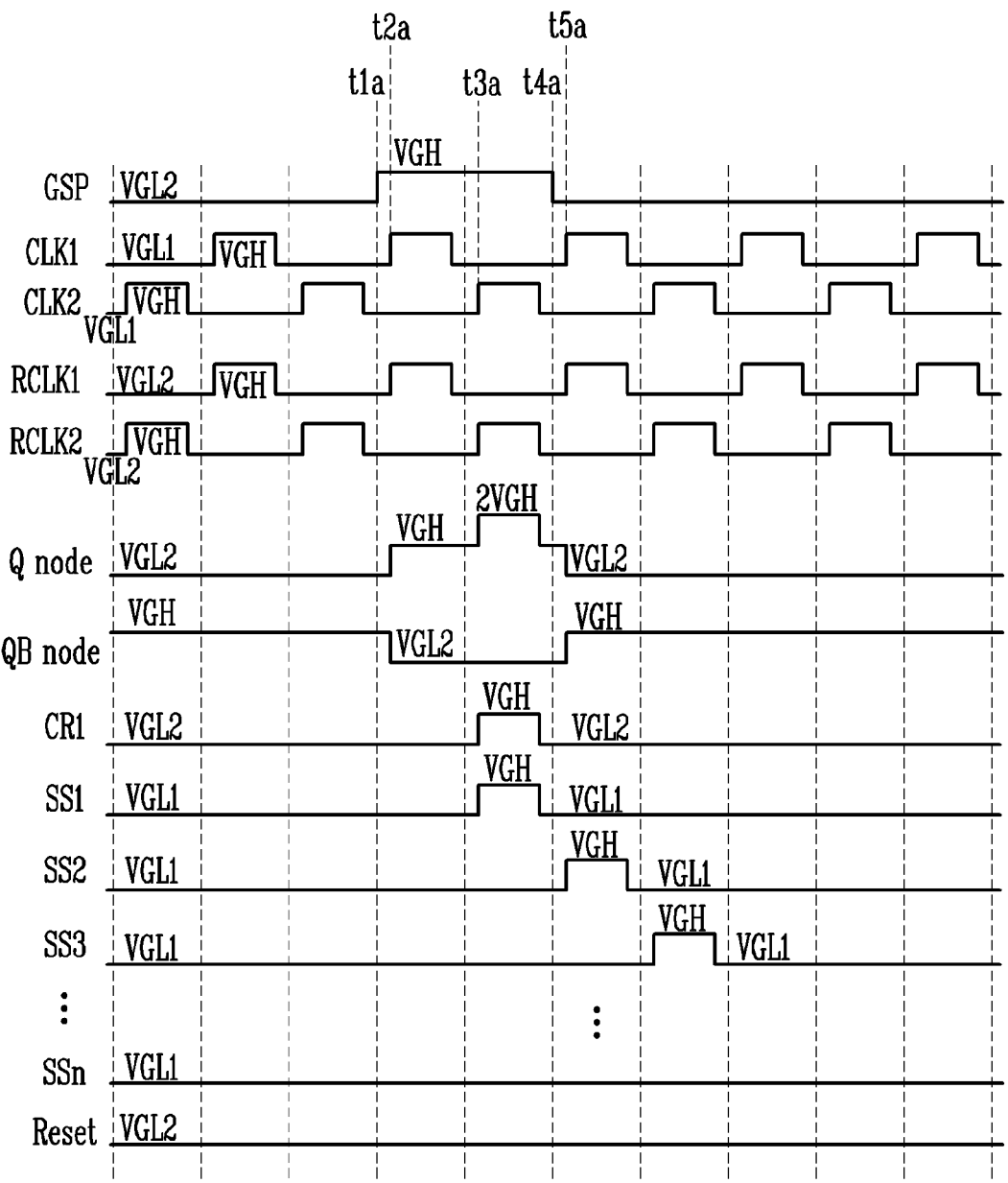
FIG. 6 is a diagram illustrating an embodiment of a method of driving the stage circuit of FIG. 5.

In an embodiment, the clock signals CLK1 and CLK2 may have a waveform in which a period is the same and a phase is shifted. In an embodiment, as shown in FIG. 6, the second clock signal CLK2 may be set to a signal shifted by ½ period from the first clock signal CLK1, for example. The clock signals CLK1 and CLK2 may be set to the voltage of the first power VGH during a high period and set to the voltage of the second power VGL1 during a low period.

In an embodiment, the carry clock signals RCLK1 and RCLK2 may have a waveform in which a period is the same and a phase is shifted. In an embodiment, the second carry clock signal RCLK2 may be set to a signal shifted by ½ period from the first carry clock signal RCLK1, for example. The carry clock signals RCLK1 and RCLK2 may be set to the voltage of the first power VGH during a high period and set to the voltage of the third power VGL2 during a low period. In addition, the high period of the first clock signal CLK1 and the first carry clock signal RCLK1 may overlap during at least partial period, and the high period of the second clock signal CLK2 and the second carry clock signal RCLK2 may overlap during at least partial period.

Figure 4A:
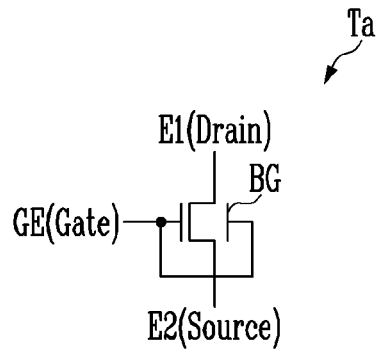
FIGS. 4A to 4C are diagrams illustrating an embodiment of transistors used in a stage.
Figure 4B:
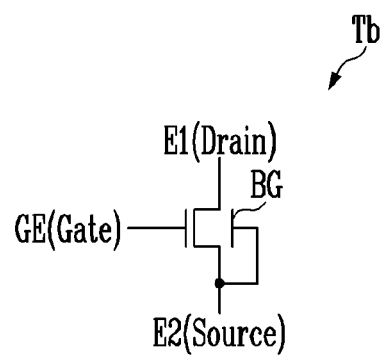
Figure 4C:
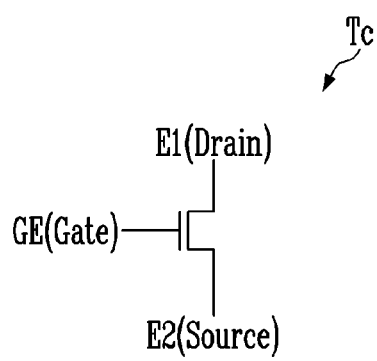

FIGS. 4A to 4C are diagrams illustrating an embodiment of transistors used in a stage. At least one of the transistors of FIGS. 4A to 4C may be an oxide semiconductor transistor.

Referring to FIGS. 4A to 4C, transistors Ta, Tb, and Tc of the disclosure may be classified as a gate sync transistor Ta, a source sync transistor Tb, and a single gate transistor Tc.

The gate sync transistor Ta and the source sync transistor Tb may include a first electrode E1 (e.g., a drain electrode), a second electrode E2 (e.g., a source electrode), a gate electrode GE, and a back-gate electrode BG.

In the gate sync transistor Ta, the back-gate electrode BG is electrically connected to the gate electrode GE. The gate sync transistor Ta in which the back-gate electrode BG is connected to the gate electrode GE may have improved mobility compared to the source sync transistor Tb and the single gate transistor Tc. In general, in a case of an N-type oxide transistor, mobility may be low, and thus supplying a sufficient driving current may be difficult. When an oxide transistor includes or consists of the gate sync transistor Ta, an electrical characteristic and mobility may be improved. However, since the same voltage is supplied to the gate electrode GE and the back-gate electrode BG, the gate sync transistor Ta may be easily deteriorated, and thus reliability may be reduced.

In the source sync transistor Tb, the back-gate electrode BG may be electrically connected to the second electrode E2. The source sync transistor Tb in which the back-gate electrode BG is connected to the second electrode E2 may have improved mobility compared to the single gate transistor Tc. In addition, since different voltages are supplied to the gate electrode GE and the back-gate electrode BG, deterioration is progressed slowly compared to the gate sync transistor Ta, and thus reliability may be improved.

The single gate transistor Tc may be a generally used transistor and may have relatively low mobility. However, the single gate transistor Tc may secure higher reliability compared to the gate sync transistor Ta and the source sync transistor Tb.

In an embodiment of the disclosure, the stage circuit may be implemented using the above-described gate sync transistor Ta, source sync transistor Tb, and single gate transistor Tc.

In an embodiment, a transistor that maintains a turn-on state during a relatively long time may secure reliability using the source sync transistor Tb or the single gate transistor Tc, and a transistor that maintains a turn-on state during a relatively short time may secure relatively high mobility using the gate sync transistor Ta, for example. In an embodiment, a use position of the gate sync transistor Ta, the source sync transistor Tb, and the single gate transistor Tc may be experimentally determined to secure reliability.

Figure 5:
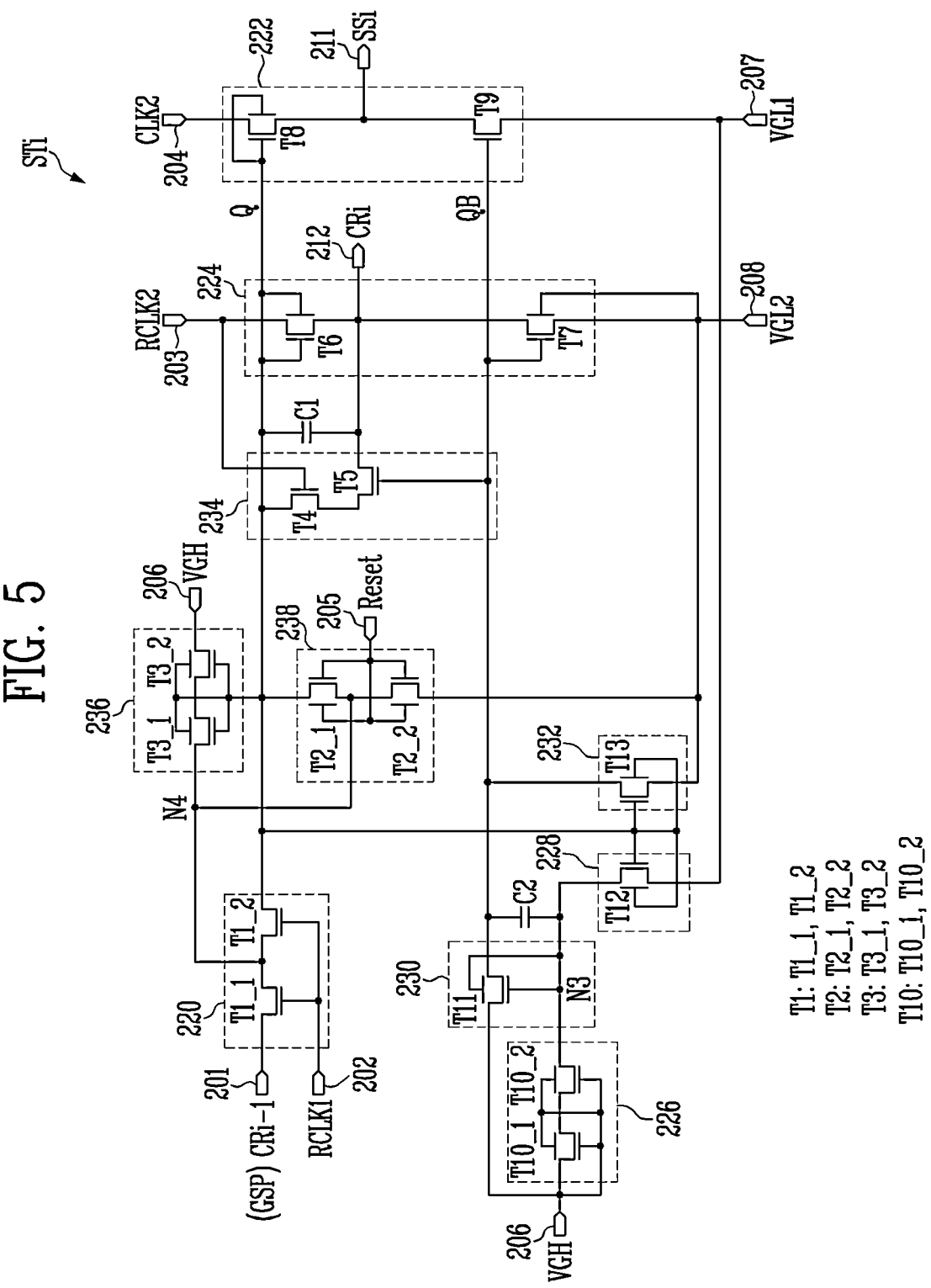
FIG. 5 is a diagram illustrating an embodiment of a stage circuit according to the disclosure.

FIG. 5 is a diagram illustrating a stage circuit according to an embodiment of the disclosure. Hereinafter, for convenience of description, a case where the clock signals CLK1 and CLK2 are supplied means that a gate-on voltage (e.g., a relatively high voltage VGH) is supplied, and a case where the clock signals CLK1 and CLK2 are not supplied means that a gate-off voltage (e.g., a relatively low voltage VGL1) is supplied. In addition, a case where the carry clock signals RCLK1 and RCLK2 are supplied means the gate-on voltage (e.g., the relatively high voltage VGH) is supplied, and a case where the carry clock signals RCLK1 and RCLK2 are not supplied means the gate-off voltage (e.g., a relatively low voltage VGL2) is supplied. In addition, in FIG. 5, a stage circuit configuration is described using the i-th stage STi, and stages ST1 to STi−1 and STi+1 to STn except for the i-th stage STi may also have the same circuit structure as that of the i-th stage STi.

Referring to FIG. 5, the stage STi of the disclosure may include an input unit 220, a first output unit 222, a second output unit 224, a first control unit 226, a second control unit 228, a first driving unit 230, a second driving unit 232, a third driving unit 234, a fourth driving unit 236, and a reset unit 238. In addition, the stage STi of the disclosure may include a first capacitor C1 and a second capacitor C2.

The input unit 220 is connected to the first input terminal 201 and the second input terminal 202 to control a voltage of a first node Q. To this end, the input unit 220 may include a first transistor T1. The first transistor T1 may include a (1-1)-th transistor T1_1 and a (1-2)-th transistor T1_2 connected in series between the first input terminal 201 and the first node Q. A gate electrode of the (1-1)-th transistor T1_1 and the (1-2)-th transistor T1_2 may be connected to the second input terminal 202. In addition, a common node between the (1-1)-th transistor T1_1 and the (1-2)-th transistor T1_2 may be electrically connected to a fourth node N4. In FIG. 5, the first transistor T1 is configured of two transistors T1_1 and T1_2, but the disclosure is not limited thereto. In an embodiment, the first transistor T1 may be configured by connecting three or more transistors in series, for example.

When the first carry clock signal RCLK1 is supplied to the second input terminal 202, the (1-1)-th transistor T1_1 and the (1-2)-th transistor T1_2 are turned on. When the (1-1)-th transistor T1_1 and the (1-2)-th transistor T1_2 are turned on, the first input terminal 201 and the first node Q are electrically connected. Here, since the (1-1)-th transistor T1_1 and the (1-2)-th transistor T1_2 receive the carry signal CRi−1 or the gate start pulse GSP from the first input terminal 201, relatively high reliability is desired. Therefore, the (1-1)-th transistor T1_1 and the (1-2)-th transistor T1_2 may be implemented with the single gate transistor Tc.

The first output unit 222 controls a voltage of the first output terminal 211 in response to a voltage of the first node Q and the second node QB. In an embodiment, the first output unit 222 may supply the second clock signal CLK2 supplied to the fourth input terminal 204 in response to the voltage of the first node Q to the first output terminal 211 as the scan signal SSi, for example.

To this end, the first output unit 222 may include an eighth transistor T8 and a ninth transistor T9. A first electrode of the eighth transistor T8 is connected to the fourth input terminal 204 and a second electrode is connected to the first output terminal 211. In addition, a gate electrode and a back-gate electrode of the eighth transistor T8 are connected to the first node Q. The eighth transistor T8 may control an electrical connection between the fourth input terminal 204 and the first output terminal 211 in response to the voltage of the first node Q.

The eighth transistor T8 supplies the scan signal SSi to the first output terminal 211, and relatively high mobility may be desired. The eighth transistor T8 may maintain a turn-on state when the scan signal SSi is supplied to the first output terminal 211 and may maintain a turn-off state during other periods. That is, the eighth transistor T8 may maintain the turn-on state during a short time, and thus the eighth transistor T8 may be implemented with the gate sync transistor Ta. When the eighth transistor T8 is implemented with the gate sync transistor Ta, the eighth transistor T8 may have relatively high mobility, and thus may stably output the scan signal SSi.

A first electrode of the ninth transistor T9 is connected to the first output terminal 211, and a second electrode is connected to the second power input terminal 207. In addition, a gate electrode of the ninth transistor T9 is connected to the second node QB. Such a ninth transistor T9 may control a connection between the first output terminal 211 and the second power input terminal 207 in response to the voltage of the second node QB.

The ninth transistor T9 maintains a turn-on state during a period in which the scan signal SSi is not supplied to the first output terminal 211. The ninth transistor T9 maintains a turn-on state during a relatively long time, and thus may be implemented with the single gate transistor Tc to have relatively high reliability.

The second output unit 224 controls a voltage of the second output terminal 212 in response to the voltage of the first node Q and the second node QB. In an embodiment, the second output unit 224 may output the second carry clock signal RCLK2 supplied to the third input terminal 203 in response to the voltage of the first node Q as the carry signal CRi to the second output terminal 212, for example.

To this end, the second output unit 224 may include a sixth transistor T6 and a seventh transistor T7. A first electrode of the sixth transistor T6 is connected to the third input terminal 203 and a second electrode is connected to the second output terminal 212. In addition, a gate electrode and a back-gate electrode of the sixth transistor T6 are connected to the first node Q. Such a sixth transistor T6 may control an electrical connection between the third input terminal 203 and the second output terminal 212 in response to the voltage of the first node Q.

The sixth transistor T6 supplies the carry signal CRi to the second output terminal 212, and relatively high mobility may be desired. The sixth transistor T6 may maintain a turn-on state when the carry signal CRi is supplied to the second output terminal 212 and may maintain a turn-off state during other periods. That is, the sixth transistor T6 may maintain the turn-on state during a short time, and thus the sixth transistor T6 may be implemented with the gate sync transistor Ta. When the sixth transistor T6 is implemented with the gate sync transistor Ta, the sixth transistor T6 may have relatively high mobility and thus may stably output the carry signal CRi.

A first electrode of the seventh transistor T7 is connected to the second output terminal 212, and a second electrode is connected to the third power input terminal 208. In addition, a gate electrode of the seventh transistor T7 is connected to the second node QB, and a back-gate electrode is connected to the third power input terminal 208. The seventh transistor T7 may control a connection between the second output terminal 212 and the third power input terminal 208 in response to the voltage of the second node QB. The seventh transistor T7 may be implemented with the source sync transistor Tb.

The first control unit 226 controls a voltage of a third node N3. To this end, the first control unit 226 may include a tenth transistor T10. The tenth transistor T10 may include a (10-1)-th transistor T10_1 and a (10-2)-th transistor T10_2 connected in series between the first power input terminal 206 and the third node N3.

A gate electrode of the (10-1)-th transistor T10_1 and the (10-2)-th transistor T10_2 is connected to the first power input terminal 206. That is, the (10-1)-th transistor T10_1 and the (10-2)-th transistor T10_2 are connected in a diode form so that a current may flow from the first power input terminal 206 to the third node N3. In an embodiment, the (10-1)-th transistor T10_1 and the (10-2)-th transistor T10_2 may supply the voltage of the first power VGH of the first power input terminal 206 to the third node N3 while maintaining a turn-on state, for example.

The (10-1)-th transistor T10_1 and the (10-2)-th transistor T10_2 are connected in a diode form and maintain a turn-on state. In this case, even though the (10-1)-th transistor T10_1 and the (10-2)-th transistor T10_2 are deteriorated, the turn-on state may be stably maintained, and thus the (10-1)-th transistor T10_1 and the (10-2)-th transistor T10_2 may be implemented with the gate sync transistor Ta. However, the (10-1)-th transistor T10_1 and the (10-2)-th transistor T10_2 may be implemented with the single gate transistor Tc when desired.

In FIG. 5, the tenth transistor T10 is configured of the two transistors T10_1 and T10_2, but the disclosure is not limited thereto. In an embodiment, the tenth transistor T10 may be configured by connecting three or more transistors in series, for example.

The second control unit 228 controls the voltage of the third node N3. To this end, the second control unit 228 may include a twelfth transistor T12 connected between the third node N3 and the second power input terminal 207. A gate electrode and a back-gate electrode of the twelfth transistor T12 are connected to the first node Q. Such a twelfth transistor T12 may electrically connect the third node N3 and the second power input terminal 207 in response to the voltage of the first node Q.

In an embodiment, when the twelfth transistor T12 is turned on, the third node N3 and the second power input terminal 207 are electrically connected, and thus the voltage of the second power VGL1 may be supplied to the third node N3. At this time, the third node N3 may also receive the voltage of the first power VGH via the tenth transistor T10 of the turn-on state.

In an embodiment, the voltage of the first power VGH is supplied via the diode-connected tenth transistor T10, and the voltage of the second power VGL1 is supplied via the fully turned-on twelfth transistor T12. Therefore, when the twelfth transistor T12 is set to a turn-on state, the voltage of the third node N3 may be reduced to the voltage of the second power VGL1. That is, the voltage of the third node N3 may be set to the voltage of the second power VGL1 when the twelfth transistor T12 is set to the turn-on state, and the voltage of the third node N3 may be set to the voltage of the first power VGH when the twelfth transistor T12 is set to a turn-off state. The twelfth transistor T12 is for decreasing the voltage of the third node N3, and relatively high mobility may be desired. In addition, the twelfth transistor T12 is turned on only when the first node Q is set to a relatively high voltage, and may be implemented with the gate sync transistor Ta.

The first driving unit 230 controls an electrical connection between the first power input terminal 206 and the second node QB in response to the voltage of the third node N3. To this end, the first driving unit 230 may include an eleventh transistor T11 connected between the first power input terminal 206 and the second node QB. A gate electrode and a back-gate electrode of the eleventh transistor T11 are connected to the third node N3.

The eleventh transistor T11 is set to a turn-on state when the third node N3 is set to a relatively high voltage, that is, when the twelfth transistor T12 is set to the turn-off state. When the eleventh transistor T11 is turned on, the voltage of the first power VGH may be supplied to the second node QB. The eleventh transistor T11 may be implemented with the gate sync transistor Ta. However, the eleventh transistor T11 may also be implemented with the single gate transistor Tc or the source sync transistor Tb.

The second driving unit 232 may control the voltage of the second node QB in response to the voltage of the first node Q. To this end, the second driving unit 232 may include a thirteenth transistor T13. The thirteenth transistor T13 may be connected between the second node QB and the third power input terminal 208. In addition, a gate electrode and a back-gate electrode of the thirteenth transistor T13 are connected to the first node Q. The thirteenth transistor T13 may be turned on when the first node Q is set to a relatively high voltage to supply the voltage of the third power VGL2 to the second node QB. Such a thirteenth transistor T13 may be implemented with the gate sync transistor Ta.

The third driving unit 234 may control a voltage of the second output terminal 212 in response to voltages of the third input terminal 203, the first node Q, and the second node QB. To this end, the third driving unit 234 may include a fourth transistor T4 and a fifth transistor T5. The fourth transistor T4 is connected between the first node Q and a first electrode of the fifth transistor T5. In addition, a gate electrode of the fourth transistor T4 is connected to the third input terminal 203. The fourth transistor T4 may be turned on in response to the second carry clock signal RCLK2 supplied to the third input terminal 203. The fourth transistor T4 may be implemented with the single gate transistor.

The fifth transistor T5 is connected between a second electrode of the fourth transistor T4 and the second output terminal 212. In addition, a gate electrode of the fifth transistor T5 is connected to the second node QB. The fifth transistor T5 is turned on or off in response to the voltage of the second node QB. The fifth transistor T5 may be implemented with the single gate transistor.

The fourth driving unit 236 prevents a relatively high voltage from being applied between transistors (e.g., the first transistor T1 and the second transistor T2) in response to a voltage increase of the first node Q. To this end, the fourth driving unit 236 may include a third transistor T3 connected between the first power input terminal 206 and the fourth node N4.

The third transistor T3 may include a (3-1)-th transistor T3_1 and a (3-2)-th transistor T3_2 connected in series between the fourth node N4 and the first power input terminal 206. A gate electrode and a back-gate electrode of the (3-1)-th transistor T3_1 and the (3-2)-th transistor T3_2 are connected to the first node Q. The third transistor T3 may control an electrical connection between the first power input terminal 206 and the fourth node N4 in response to the voltage of the first node Q.

The third transistor T3 may maintain a turn-on state when the scan signal SSi is supplied to the first output terminal 211 and may maintain a turn-off state during other periods. That is, the third transistor T3 may maintain the turn-on state during a short time, and thus the third transistor T3 (i.e., the (3-1)-th transistor T3_1 and the (3-2)-th transistor T3_2) may be implemented with the gate sync transistor Ta. When the third transistor T3 is implemented with the gate sync transistor Ta, the third transistor T3 may have relatively high mobility, and thus may be stably driven.

In FIG. 5, the third transistor T3 is configured of the two transistors T3_1 and T3_2, but the disclosure is not limited thereto. In an embodiment, the third transistor T3 may be configured by connecting three or more transistors in series, for example.

The fourth node N4 is electrically connected to a common node between the first transistors T1_1 and T1_2 and a common node between the second transistors T2_1 and T2_2. Therefore, when the third transistor T3 is turned on, the voltage of the first power VGH may be supplied to the common node between the first transistors T1_1 and T1_2 and the common node between the second transistors T2_1 and T2_2, and thus a relatively high voltage may be prevented from being applied between the (1-2)-th transistor T1_2 and the (2-1)-th transistor T2_1.

The reset unit 238 may supply the voltage of the third power VGL2 to the first node Q when the reset signal Reset is supplied. That is, the reset unit 238 may initialize the first node Q to the voltage of the third power VGL2 when the reset signal Reset is supplied. To this end, the reset unit 238 may include a second transistor T2 connected between the first node Q and the third power input terminal 208. The second transistor T2 may include a (2-1)-th transistor T2_1 and a (2-2)-th transistor T2_2 connected in series between the first node Q and the third power input terminal 208. A gate electrode and a back-gate electrode of the (2-1)-th transistor T2_1 and the (2-2)-th transistor T2_2 are connected to the fifth input terminal 205.

The (2-1)-th transistor T2_1 and the (2-2)-th transistor T2_2 are turned on when the reset signal Reset is supplied to the fifth input terminal 205. Since the (2-1)-th transistor T2_1 and the (2-2)-th transistor T2_2 are turned on only in a period in which the reset signal Reset is supplied, that is, the (2-1)-th transistor T2_1 and the (2-2)-th transistor T2_2 maintain a turn-on state during a short time, the (2-1)-th transistor T2_1 and the (2-2)-th transistor T2_2 may be implemented with the gate sync transistor Ta. When the second transistor T2 is implemented with the gate sync transistor Ta, the second transistor T2 may have relatively high mobility, and thus may be stably driven.

In FIG. 5, the second transistor T2 is configured of the two transistors T2_1 and T2_2, but the disclosure is not limited thereto. In an embodiment, the second transistor T2 may be configured by connecting three or more transistors in series, for example.

The first capacitor C1 is connected between the first node Q and the second output terminal 212. The first capacitor C1 stores the voltage of the first node Q.

The second capacitor C2 is connected between the second node QB and the third node N3. The second capacitor C2 may be used to stabilize the voltage of the second node QB.

FIG. 6 is a diagram illustrating an embodiment of a method of driving the stage circuit of FIG. 5. When describing FIG. 6, it is assumed that the i-th stage STi is a first stage.

Referring to FIG. 6, first, at a first time point t1a, the gate start pulse GSP is supplied to the first input terminal 201. The gate start pulse GSP may be supplied with the voltage of the first power VGH.

Thereafter, at a second time point t2a, the first clock signal CLK1 and the first carry clock signal RCLK1 are supplied. The first carry clock signal RCLK1 is supplied to the second input terminal 202, and thus the first transistor T1 is turned on. When the first transistor T1 is turned on, the gate start pulse GSP supplied to the first input terminal 201 is supplied to the first node Q, and thus the first node Q is set to a relatively high voltage (e.g., VGH). To this end, a supply period (i.e., a high period) of the first carry clock signal RCLK1 supplied to the second input terminal 202 may overlap that of the gate start pulse (or the carry signal) supplied to the first input terminal 201.

When the first node Q is set to the relatively high voltage, the third transistor T3, the sixth transistor T6, the eighth transistor T8, the twelfth transistor T12, and the thirteenth transistor T13 are turned on.

When the third transistor T3 is turned on, the voltage of the first power VGH is supplied to the fourth node N4. The voltage of the first power VGH supplied to the fourth node N4 is supplied to the common node of the first transistors T1_1 and T1_2 and the common node of the second transistors T2_1 and T2_2.

When the sixth transistor T6 is turned on, the third input terminal 203 and the second output terminal 212 are electrically connected. When the eighth transistor T8 is turned on, the fourth input terminal 204 and the first output terminal 211 are electrically connected.

When the twelfth transistor T12 is turned on, the third node N3 and the second power input terminal 207 are electrically connected. Then, the voltage of the second power VGL1 from the second power input terminal 207 is supplied to the third node N3, and thus the eleventh transistor T11 is turned off.

When the thirteenth transistor T13 is turned on, the second node QB and the third power input terminal 208 are electrically connected. Then, the voltage of the third power VGL2 from the third power input terminal 208 is supplied to the second node QB. When a relatively low voltage (e.g., VGL2) is supplied to the second node QB, the fifth transistor T5, the seventh transistor T7, and the ninth transistor T9 are turned off.

Thereafter, at a third time point t3a, the second clock signal CLK2 is supplied to the fourth input terminal 204 and the second carry clock signal RCLK2 is supplied to the third input terminal 203. At this time, the second clock signal CLK2 supplied to the fourth input terminal 204 is supplied to the first output terminal 211 via the eighth transistor T8 set to the turn-on state. The second clock signal CLK2 supplied to the first output terminal 211 is supplied to the scan line as the scan signal SSi.

The second carry clock signal RCLK2 supplied to the third input terminal 203 is supplied to the second output terminal 212 via the transistor T6 set to the turn-on state. The second carry clock signal RCLK2 supplied to the second output terminal 212 is supplied to a next stage as the carry signal CRi.

In an embodiment, the second clock signal CLK2 supplied to the fourth input terminal 204 may be supplied to the first output terminal 211 via the eighth transistor T8 connected in a gate sync form. In this case, a voltage of the second clock signal CLK2 may be stably supplied to the first output terminal 211 by the relatively high mobility of the eighth transistor T8.

Similarly, the second carry clock signal RCLK2 supplied to the third input terminal 203 may be supplied to the second output terminal 212 via the sixth transistor T6 connected in a gate sync form. In this case, a voltage of the second carry clock signal RCLK2 may be stably supplied to the second output terminal 212 by the relatively high mobility of the sixth transistor T6.

When the second carry clock signal RCLK2 is supplied to the second output terminal 212, the voltage of the first node Q increases to a relatively high voltage (e.g., 2VGH) by the first capacitor C1. At this time, since the voltage of the first power VGH is supplied to a common terminal of the first transistor T1 and the second transistor T2, even though the voltage of the first node Q increase to the relatively high voltage 2VGH, a voltage applied to the (1-2)-th transistor T1_2 and the (2-1)-th transistor T2_1 may be set to a maximum voltage of the first power VGH, and thus the (1-2)-th transistor T1_2 and the (2-1)-th transistor T2_1 may be prevented from being damaged by the relatively high voltage 2VGH.

Additionally, the fourth transistor T4 may be turned on by the second carry clock signal RCLK2 supplied to the third input terminal 203. Even though the fourth transistor T4 is turned on, since the fifth transistor T5 is set to a turn-off state, the first node Q and the second output terminal 212 are not electrically connected.

Thereafter, at a fourth time point t4a, the supply of the gate start pulse GSP is stopped, and at a fifth time point t5a, the first clock signal CLK1 and the first carry clock signal RCLK1 are supplied. The first carry clock signal RCLK1 is supplied to the second input terminal 202, and thus the first transistor T1 is turned on. When the first transistor T1 is turned on, a relatively low voltage (e.g., VGL2) of the first input terminal 201 is supplied to the first node Q.

When the first node Q is set to the relatively low voltage, the third transistor T3, the sixth transistor T6, the eighth transistor T8, the twelfth transistor T12, and the thirteenth transistor T13 are turned off.

When the third transistor T3 is turned off, an electrical connection between the fourth node N4 and the first power input terminal 206 is cut off. Therefore, the fourth node N4 is decreased to the relatively low voltage (e.g., VGL2).

When the sixth transistor T6 is turned off, an electrical connection between the third input terminal 203 and the second output terminal 212 is cut off. When the eighth transistor T8 is turned off, an electrical connection between the fourth input terminal 204 and the first output terminal 211 is cut off.

When the thirteenth transistor T13 is turned off, an electrical connection between the second node QB and the third power input terminal 208 is cut off.

When the twelfth transistor T12 is turned off, an electrical connection between the third node N3 and the second power input terminal 207 is cut off. At this time, the third node N3 is set to a relatively high voltage (e.g., VGH) by the tenth transistor T10 of the turn-on state. When the third node N3 is set to the relatively high voltage, the eleventh transistor T11 is turned on. When the eleventh transistor T11 is turned on, the voltage of the first power VGH from the first power input terminal 206 is supplied to the second node QB.

When the second node QB is set to a relatively high voltage (e.g., VGH), the fifth transistor T5, the seventh transistor T7, and the ninth transistor T9 are turned on. When the fifth transistor T5 is turned on, the fourth transistor T4 and the second output terminal 212 are electrically connected.

When the seventh transistor T7 is turned on, the second output terminal 212 and the third power input terminal 208 are electrically connected. Then, the voltage of the third power VGL2 from the third power input terminal 208 is supplied to the second output terminal 212.

When the ninth transistor T9 is turned on, the first output terminal 211 and the second power input terminal 207 are electrically connected. Then, the voltage of the second power VGL1 from the second power input terminal 207 is supplied to the first output terminal 211.

Thereafter, when the second carry clock signal RCLK2 is supplied, the fourth transistor T4 is turned on. At this time, since the fifth transistor T5 maintains a turn-on state, when the fourth transistor T4 is turned on, the second output terminal 212 and the first node Q are electrically connected. Then, the voltage of the third power VGL2 supplied to the second output terminal 212 is supplied to the first node Q. That is, the voltage of the first node Q may be initialized to the voltage of the third power VGL2 whenever the second carry clock signal RCLK2 is supplied.

Additionally, after the fifth time point t5a, the first node Q may be set to the voltage of the third power VGL2, and a voltage of the fourth input terminal 204 may be set to the voltage of the second power VGL1 or the first power VGH. Here, the third power VGL2 may be set to a voltage lower than that of the second power VGL1, and thus the eighth transistor T8 may stably maintain the turn-off state.

Actually, the stages ST1 to STn of the disclosure may supply the scan signal SSi to the first output terminal 211 and supply the carry signal CRi to the second output terminal 212 while repeating the above-described process. In an embodiment, the next stage STi+1 of the i-th stage STi may output the scan signal SSi to be synchronized with the first clock signal CLK1, for example. That is, as shown in FIG. 6, scan signals SS1 to SSn may be sequentially supplied to scan lines SL1 to SLn.

Figure 7:
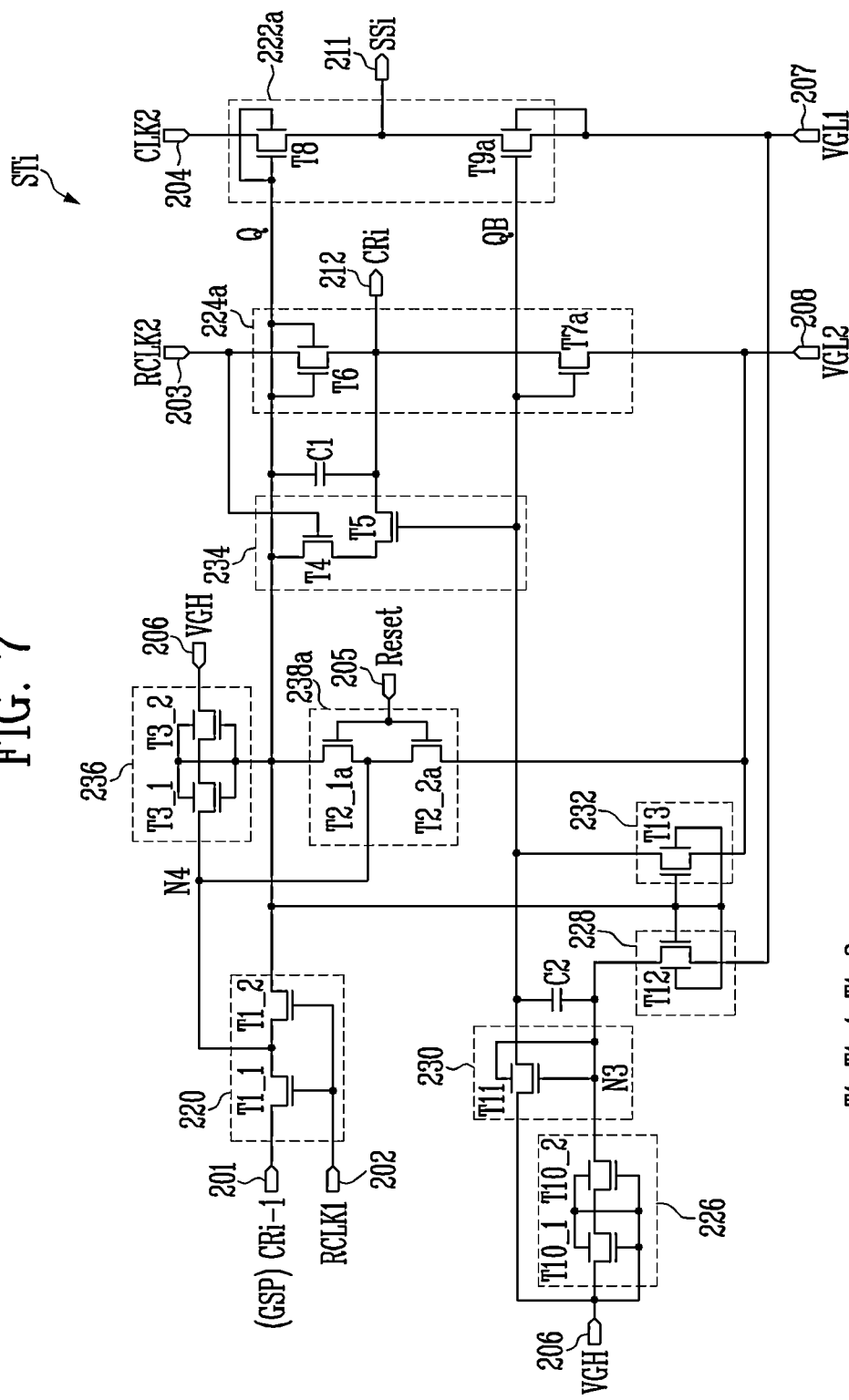
FIG. 7 is a diagram illustrating an embodiment of a stage circuit according to the disclosure.

FIG. 7 is a diagram illustrating an embodiment of a stage circuit according to the disclosure. When describing FIG. 7, a detailed description of a configuration overlapping that of FIG. 5 is omitted.

Referring to FIG. 7, the stage STi according in an embodiment of the disclosure includes the input unit 220, a first output unit 222a, a second output unit 224a, the first control unit 226, the second control unit 228, the first driving unit 230, the second driving unit 232, the third driving unit 234, the fourth driving unit 236, and a reset unit 238a. In addition, the stage STi of the disclosure may include the first capacitor C1 and the second capacitor C2.

The first output unit 222a may include a ninth transistor T9a connected between the first output terminal 211 and the second power input terminal 207. A gate electrode of the ninth transistor T9a may be connected to the second node QB, and a back-gate electrode may be connected to the second power input terminal 207. That is, the ninth transistor T9a may be implemented with the source sync transistor Tb.

The second output unit 224a may include a seventh transistor T7a connected between the second output terminal 212 and the third power input terminal 208. A gate electrode of the seventh transistor T7a may be connected to the second node QB. The seventh transistor T7a may be implemented with the single gate transistor Tc. When the seventh transistor T7 is implemented with the single gate transistor Tc, relatively high reliability may be secured.

The reset unit 238a includes a second transistor T2a connected between the first node Q and the third power input terminal 208. The second transistor T2a may include a (2-1)-th transistor T2_1a and a (2-2)-th transistor T2_2a connected in series between the first node Q and the third power input terminal 208. A gate electrode of the (2-1)-th transistor T2_1a and the (2-2)-th transistor T2_2a are connected to the fifth input terminal 205. In an embodiment, the (2-1)-th transistor T2_1a and the (2-2)-th transistor T2_2a may be implemented with single gate transistors.

Figure 8:
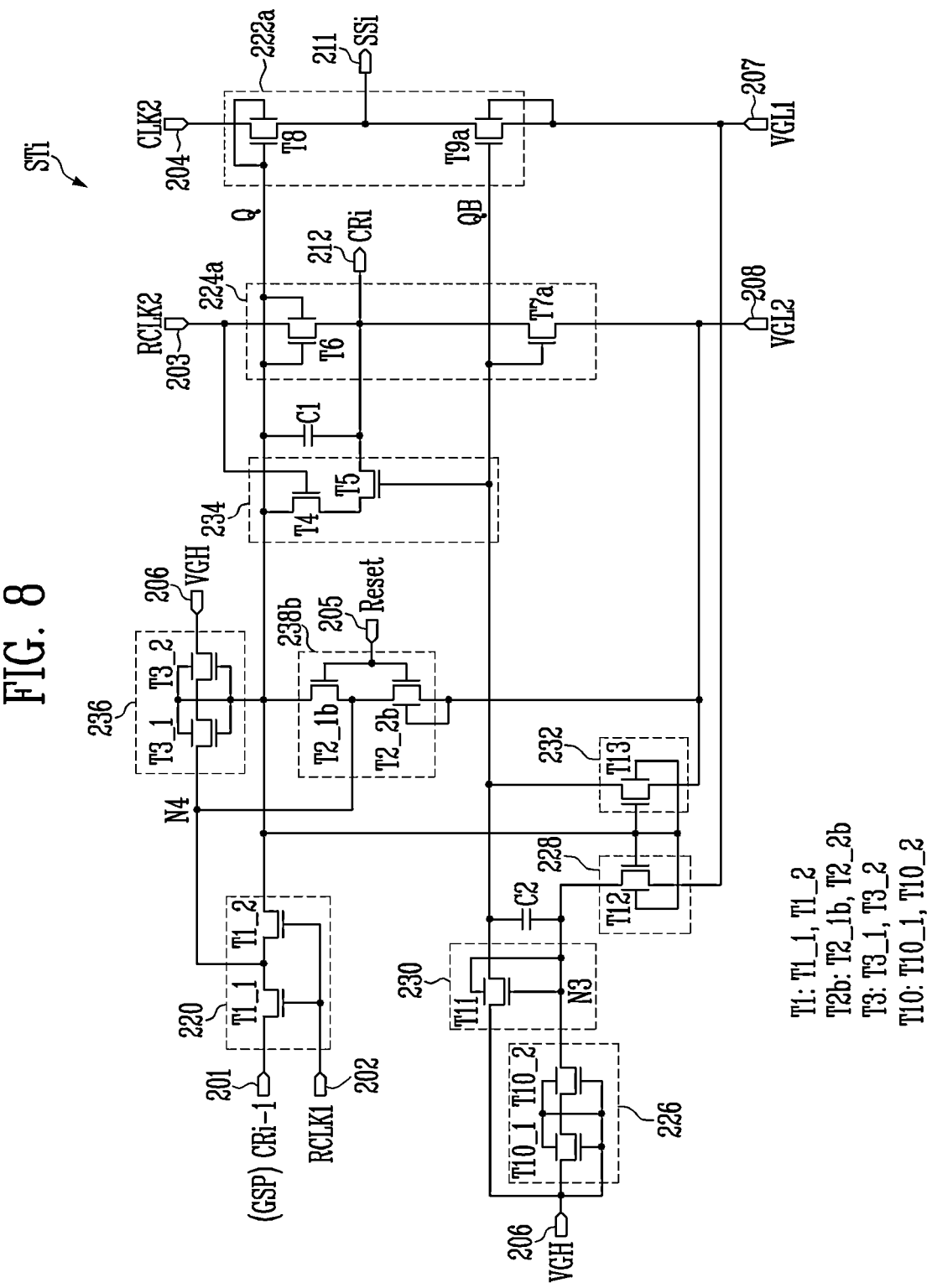
FIG. 8 is a diagram illustrating an embodiment of a stage circuit according to the disclosure.

FIG. 8 is a diagram illustrating an embodiment of a stage circuit according to the disclosure. When describing FIG. 8, a detailed description of a configuration overlapping that of FIG. 7 is omitted.

Referring to FIG. 8, the stage STi in an embodiment of the disclosure may include the input unit 220, the first output unit 222a, the second output unit 224a, the first control unit 226, the second control unit 228, the first driving unit 230, the second driving unit 232, the third driving unit 234, the fourth driving unit 236, and a reset unit 238b. In addition, the stage STi of the disclosure may include the first capacitor C1 and the second capacitor C2.

The reset unit 238b includes a second transistor T2b connected between the first node Q and the third power input terminal 208. The second transistor T2b may include a (2-1)-th transistor T2_1b and a (2-2)-th transistor T2_2b connected in series between the first node Q and the third power input terminal 208. A gate electrode of the (2-1)-th transistor T2_1b and the (2-2)-th transistor T2_2b is connected to the fifth input terminal 205. In addition, a back-gate electrode of the (2-2)-th transistor T2_2b may be connected to the third power input terminal 208.

That is, in the embodiment of the disclosure, the (2-1)-th transistor T2_1b may be implemented with the single gate transistor Tc, and the (2-2)-th transistor T2_2b may be implemented with the source sync transistor Tb.

Figure 9:
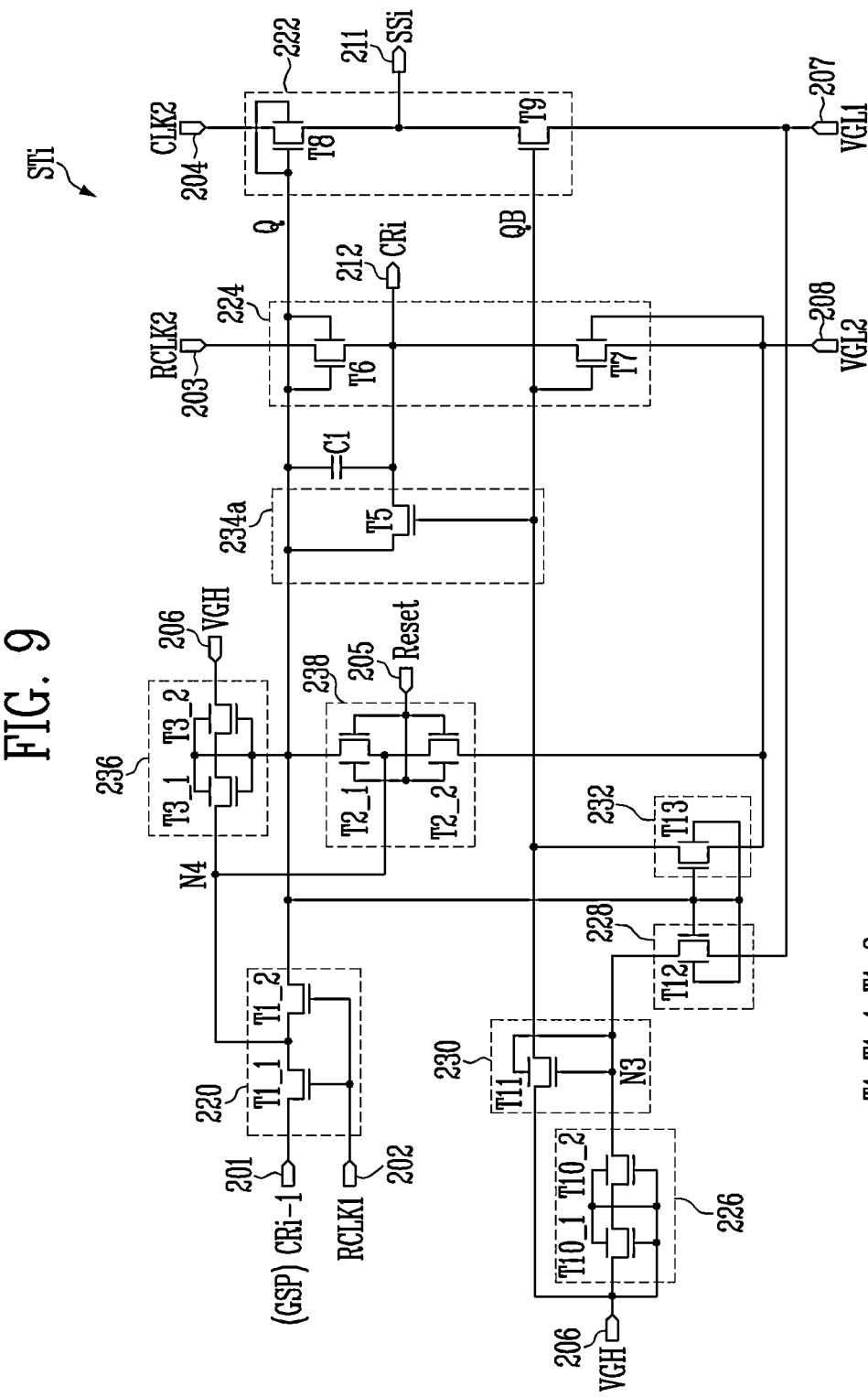
FIG. 9 is a diagram illustrating an embodiment of a stage circuit according to the disclosure.

FIG. 9 is a diagram illustrating an embodiment of a stage circuit according to an embodiment of the disclosure. When describing FIG. 9, a detailed description of a configuration overlapping that of FIG. 5 is omitted.

Referring to FIG. 9, the stage STi in an embodiment of the disclosure may include the input unit 220, the first output unit 222, the second output unit 224, the first control unit 226, the second control unit 228, the first driving unit 230, the second driving unit 232, a third driving unit 234a, the fourth driving unit 236, and the reset unit 238. In addition, the stage STi of the disclosure may include the first capacitor C1.

The third driving unit 234a includes a fifth transistor T5. The fifth transistor T5 may be connected between the first node Q and the second output terminal 212. In addition, a gate electrode of the fifth transistor T5 is connected to the second node QB. The fifth transistor T5 may control an electrical connection between the first node Q and the second output terminal 212 while being turned on and off in response to the voltage of the second node QB.

When comparing the third driving unit 234a with that of FIG. 5, the fourth transistor T4 is removed in the embodiment of the disclosure shown in in FIG. 9. When the fourth transistor T4 is removed, a load of the second carry clock signal RCLK2 may be reduced, and thus power consumption may be improved.

In addition, in the embodiment of the disclosure shown in FIG. 9, the second capacitor C2 may be removed in comparison with FIG. 5. When the second capacitor C2 is removed, an area for forming the stage STi may be reduced.

Figure 10:
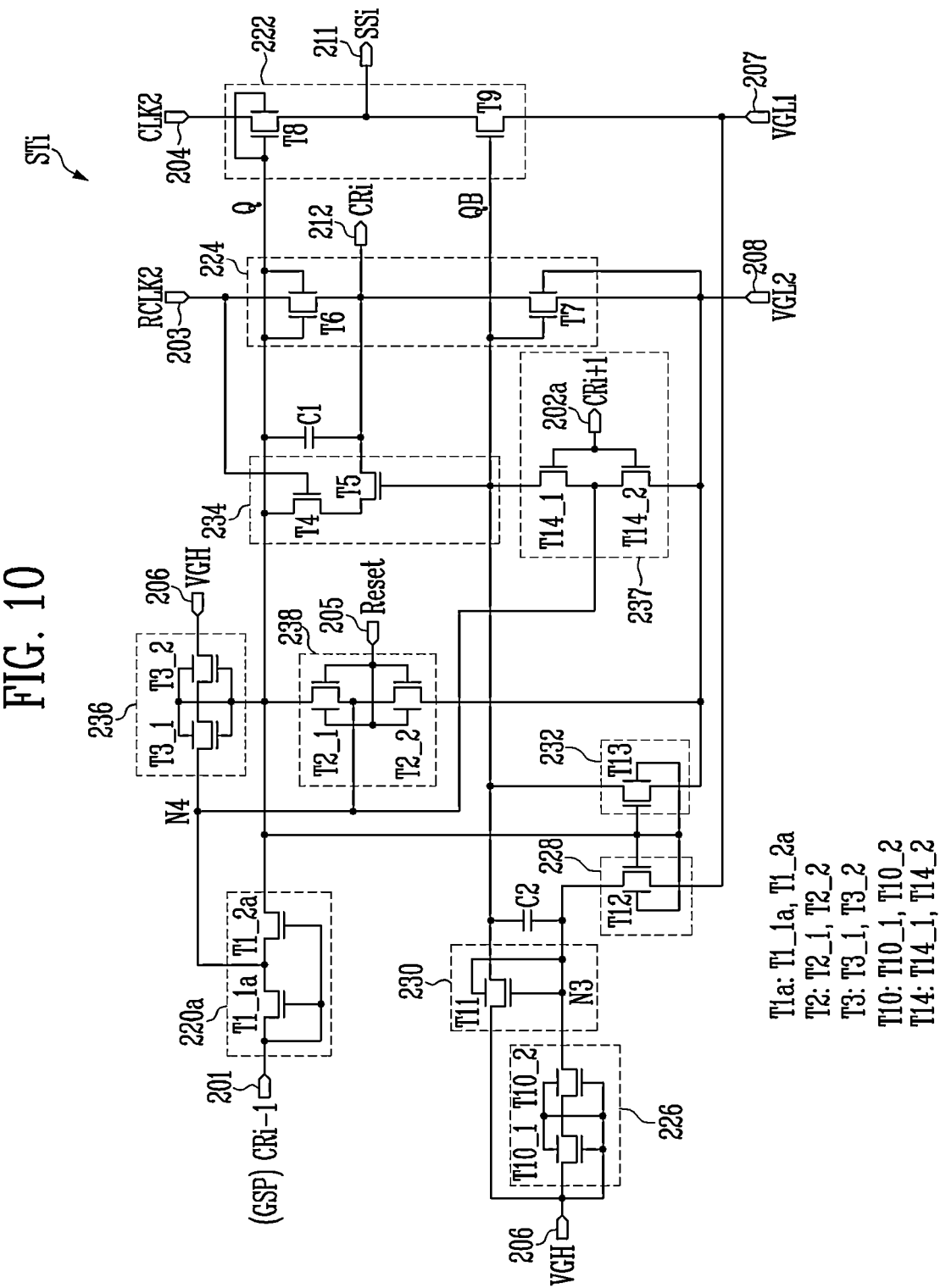
FIG. 10 is a diagram illustrating an embodiment of a stage circuit according to the disclosure.

FIG. 10 is a diagram illustrating an embodiment of a stage circuit according to the disclosure. When describing FIG. 10, a detailed description of a configuration overlapping that of FIG. 5 is omitted.

Referring to FIG. 10, the stage STi according to the embodiment of the disclosure may include an input unit 220a, the first output unit 222, the second output unit 224, the first control unit 226, the second control unit 228, the first driving unit 230, the second driving unit 232, the third driving unit 234, the fourth driving unit 236, a fifth driving unit 237, and the reset unit 238. In addition, the stage STi of the disclosure may include the first capacitor C1 and the second capacitor C2.

The input unit 220a may be connected to the first input terminal 201 to control the voltage of the first node Q. To this end, the input unit 220a may include a first transistor T1a. The first transistor T1a may include a (1-1)-th transistor T1_1a and a (1-2)-th transistor T1_2a connected in series between the first input terminal 201 and the first node Q. A gate electrode of the (1-1)-th transistor T1_1a and the (1-2)-th transistor T1_2a may be connected to the first input terminal 201. That is, the (1-1)-th transistor T1_1a and the (1-2)-th transistor T1_2a are connected in a diode form so that a current may flow from the first input terminal 201 to the first node Q.

When the gate start pulse GSP or the carry signal CRi−1 of the previous stage STi−1 is supplied to the first input terminal 201, the (1-1)-th transistor T1_1a and the (1-2)-th transistor T1_2a may be turned on, and thus a relatively high voltage may be supplied to the first node Q.

The fifth driving unit 237 may include a fourteenth transistor T14 connected between the second node QB and the third power input terminal 208. The fourteenth transistor T14 may include a (14-1)-th transistor T14_1 and a (14-2)-th transistor T14_2 connected in series between the second node QB and the third power input terminal 208.

A gate electrode of the (14-1)-th transistor T14_1 and the (14-2)-th transistor T14_2 may be connected to a second input terminal 202a. The second input terminal 202a receives the carry signal CRi+1 of the next stage STi+1. When the carry signal CRi+1 is supplied to the second input terminal 202a, the (14-1)-th transistor T14_1 and the (14-2)-th transistor T14_2 are turned on. When the (14-1)-th transistor T14_1 and the (14-2)-th transistor T14_2 are turned on, the voltage of the third power VGL2 may be supplied to the second node QB. That is, the fifth driving unit 237 may be used to initialize the second node QB to the voltage of the third power VGL2 when the carry signal CRi+1 of the next stage STi+1 is supplied.

In an embodiment, when the stage circuit of FIG. 10 is used, a dummy stage may be additionally provided compared to FIG. 5. In an embodiment, the dummy stage may be added so that the carry signal CRn+1 may be supplied to the last stage STn, for example.

Figure 11:
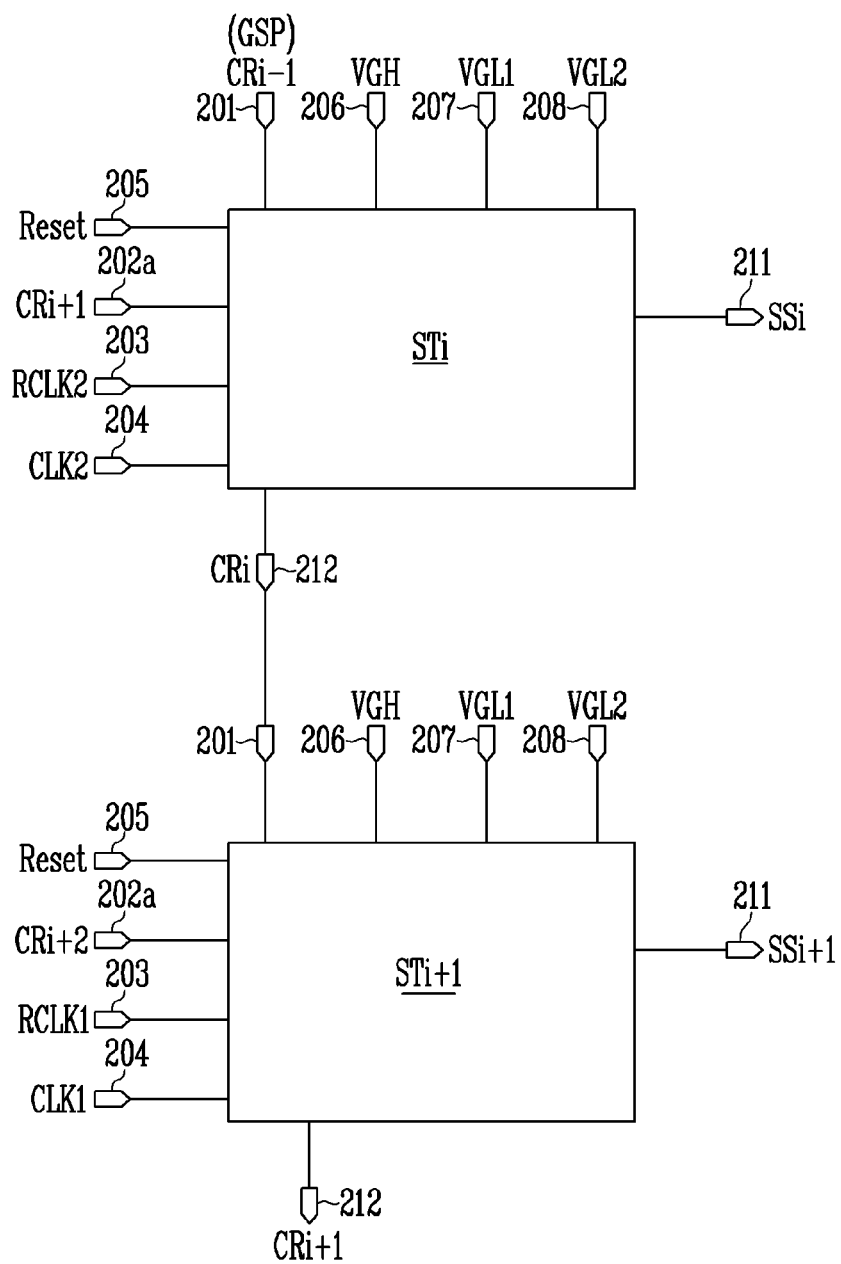
FIG. 11 is a diagram illustrating an embodiment of a stage connection terminal when the stage circuit of FIG. 10 is used.

FIG. 11 is a diagram illustrating an embodiment of a stage connection terminal when the stage circuit of FIG. 10 is used. When describing FIG. 11, a detailed description of a configuration overlapping that of FIG. 3 is omitted.

Referring to FIG. 11, each of the stages STi and STi+1 may include the first input terminal 201, a second input terminal 202a, the third input terminal 203, the fourth input terminal 204, the fifth input terminal 205, the first power input terminal 206, the second power input terminal 207, the third power input terminal 208, the first output terminal 211, and the second output terminal 212.

The first input terminal 201 may receive the carry signal CR of the previous stage. In an embodiment, the (i−1)-th carry signal CRi−1 may be input to the first input terminal 201 of the i-th stage STi, and the i-th carry signal CRi may be input to the first input terminal 201 of the (i+1)-th stage STi+1.

The second input terminal 202a of the i-th stage STi may receive the carry signal CR of the next stage. In an embodiment, the carry signal CRi+1 of the (i+1)-th stage STi+1 may be input to the second input terminal 202a of the i-th stage STi, and a carry signal CRi+2 of an (i+2)-th stage STi+2 may be input to the second input terminal 202a of the (i+1)-th stage STi+1, for example.

The third input terminal 203 of the i-th stage STi may receive the second carry clock signal RCLK2, and the third input terminal 203 of the (i+1)-th stage STi+1 may receive the first carry clock signal RCLK1.

The fourth input terminal 204 of the i-th stage STi may receive the second clock signal CLK2, and the fourth input terminal 204 of the (i+1)-th stage STi+1 may receive the first clock signal CLK1.

The reset signal Reset is supplied to the fifth input terminal 205 of the stages STi and STi+1. The reset signal Reset is for initializing the stages STi and STi+1, and may be supplied more than once when power is input. In an embodiment, the reset signal Reset may be supplied for each of a plurality of frame periods.

The voltage of the first power VGH may be supplied to the first power input terminal 206 of the stages STi and STi+1, and the voltage of the second power VGL1 may be supplied to the second power input terminal 207. In addition, the voltage of the third power VGL2 may be supplied to the third power input terminal 208 of the stages STi and STi+1.

The scan signals SSi and SSi+1 may be output from the first output terminal 211 of the stages STi and STi+1, and the carry signals CRi and CRi+1 may be output from the second output terminal 212. A supply timing of clock signals supplied to the stages ST1 to STn in an embodiment of the disclosure may be variously set. In an embodiment, in FIG. 2, the scan signals SS1 to SSn are supplied using the two clock signals CLK1 and CLK2 and the two carry clock signals RCLK1 and RCLK2, for example, but the disclosure is not limited thereto. In an embodiment, the stages ST1 to STn may be driven using three or more clock signals and/or three or more carry clock signals, for example.

Figure 12:
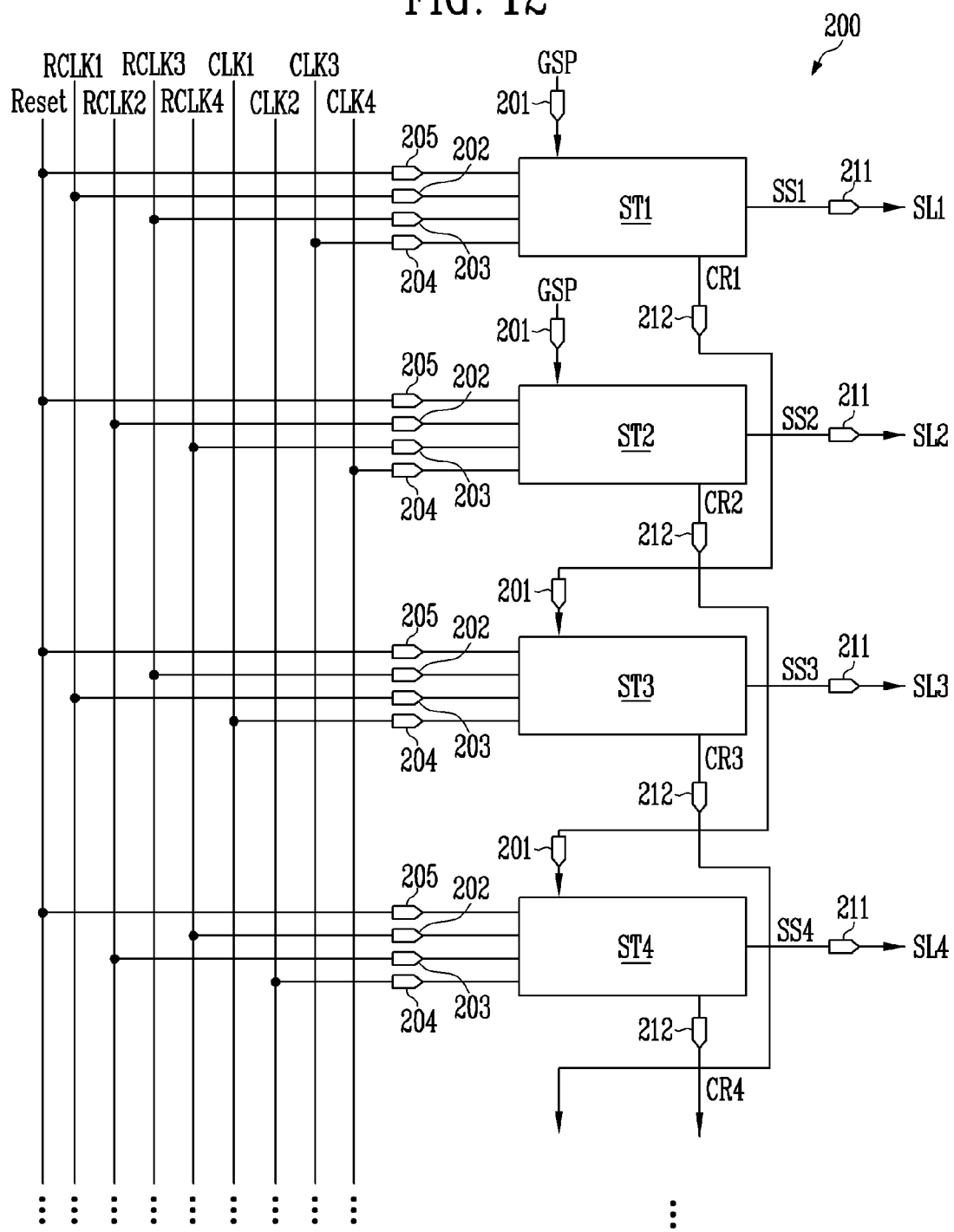
FIG. 12 is a block diagram illustrating another embodiment of a scan driver according to the disclosure.
Figure 13:
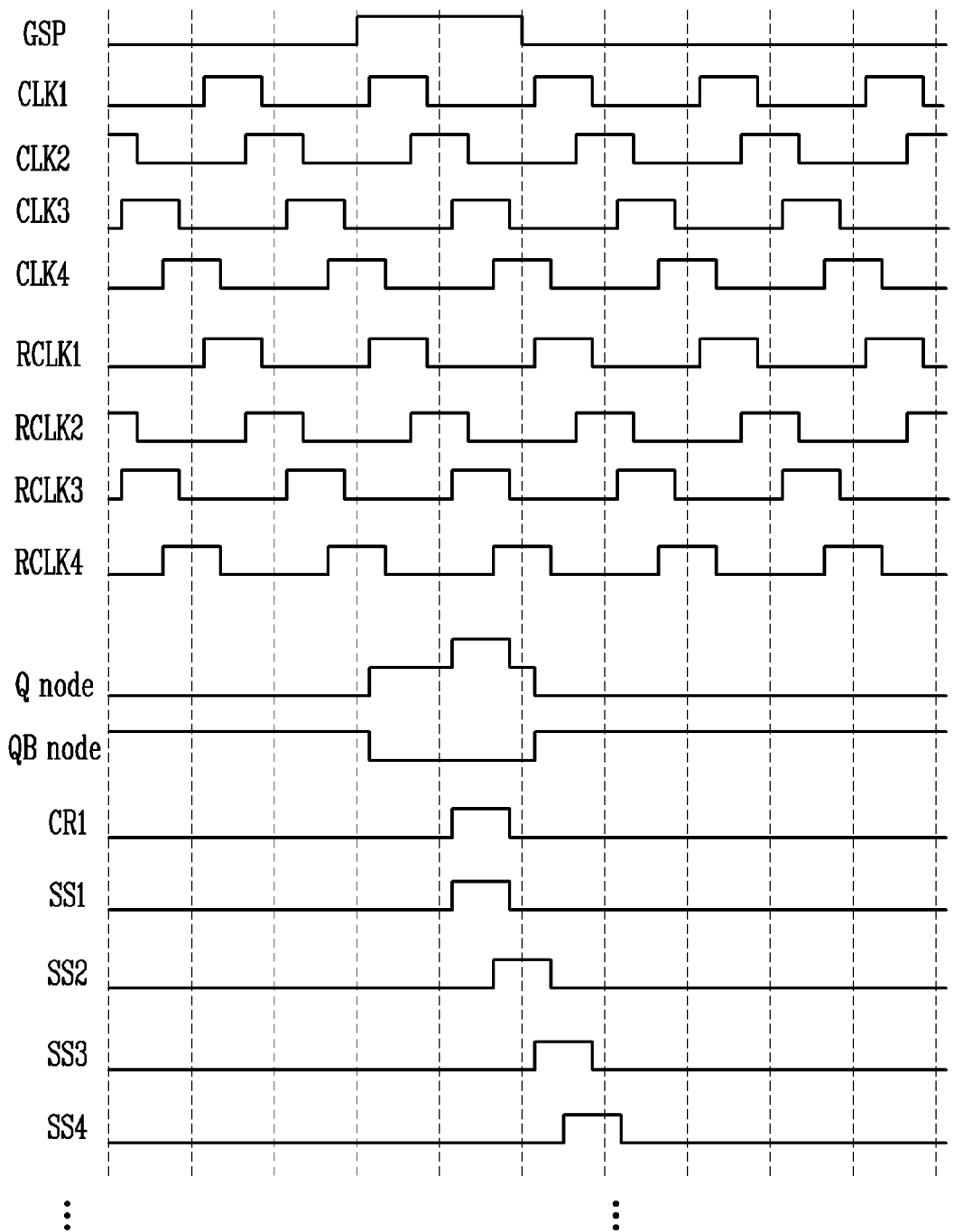
FIG. 13 is a waveform diagram illustrating a method of driving the scan driver of FIG. 12.

FIG. 12 is a block diagram illustrating another embodiment of a scan driver according to the disclosure. The scan driver of FIG. 12 may include the stage circuit as shown in FIGS. 5 and 7 to 9, and may include the terminals shown in FIG. 3 in correspondence with the stage circuit. FIG. 12 shows four stages ST1 to ST4 for convenience of description. Other stages may have a form in which the shown four stages ST1 to ST4 are repeatedly disposed. FIG. 13 is a waveform diagram illustrating a method of driving the scan driver 200 of FIG. 12.

Referring to FIGS. 5, 12, and 13, the scan driver 200 in an embodiment of the disclosure may include a plurality of stages ST1 to STn. Each of the stages ST1 to STn may be connected to any one of the scan lines SL1 to SLn, and may output the scan signals SS and the carry signals CR in response to clock signals CLK1, CLK2, CLK3, and CLK4 and carry clock signals RCLK1, RCLK2, RCLK3, and RCLK4. In an embodiment, the i-th stage STi may supply the scan signal SSi to the i-th scan line SLi connected to the i-th scan line SLi, for example.

The first stage ST1 may receive the gate start pulse GSP through the first input terminal 201 and receive the first carry clock signal RCLK1 through the second input terminal 202. In addition, the first stage ST1 may receive the third carry clock signal RCLK3 through the third input terminal 203 and receive the third clock signal CLK3 through the fourth input terminal 204.

As shown in FIG. 13, the first stage ST1 may receive the gate start pulse GSP when the first carry clock signal RCLK1 is supplied, and supply the third clock signal CLK3 to the first output terminal 211 as the first scan signal SS1 and supply the third carry clock signal RCLK3 to the second output terminal 212 as the first carry signal CR1, in response to the gate start pulse GSP.

The second stage ST2 may receive the gate start pulse GSP through the first input terminal 201 and receive the second carry clock signal RCLK2 through the second input terminal 202. In addition, the second stage ST2 may receive the fourth carry clock signal RCLK4 through the third input terminal 203 and receive the fourth clock signal CLK4 through the fourth input terminal 204.

The second stage ST2 may receive the gate start pulse GSP when the second carry clock signal RCLK2 is supplied, and supply the fourth clock signal CLK4 to the first output terminal 211 as the second scan signal SS2 and supply the fourth carry clock signal RCLK4 to the second output terminal 212 as the second carry signal CR2, in response to the gate start pulse GSP.

The third stage ST3 may receive the first carry signal CR1 through the first input terminal 201 and receive the third carry clock signal RCLK3 through the second input terminal 202. In addition, the second stage ST2 may receive the first carry clock signal RCLK1 through the third input terminal 203 and receive the first clock signal CLK1 through the fourth input terminal 204.

The third stage ST3 may receive the first carry signal CR1 when the third carry clock signal RCLK3 is supplied, and supply the first clock signal CLK1 to the first output terminal 211 as the third scan signal SS3 and supply the first carry clock signal RCLK1 to the second output terminal 212 as the third carry signal CR3, in response to the first clock signal CLK1.

The fourth stage ST4 may receive the second carry signal CR2 through the first input terminal 201 and receive the fourth carry clock signal RCLK4 through the second input terminal 202. In addition, the second stage ST2 may receive the second carry clock signal RCLK2 through the third input terminal 203 and receive the second clock signal CLK2 through the fourth input terminal 204.

The fourth stage ST4 may receive the second carry signal CR2 when the fourth carry clock signal RCLK4 is supplied, and supply the second clock signal CLK2 to the first output terminal 211 as fourth scan signal SS4 and supply the second carry clock signal RCLK2 to the second output terminal 212 as the fourth carry clock signal CR4, in response to the second carry signal CR2. Actually, the scan driver 200 in an embodiment of the disclosure may supply the scan signal SS to the scan lines S1 to Sn while repeating the above-described process.

In an embodiment, the clock signals CLK1 to CLK4 may have a waveform in which a period is the same and a phase is shifted. In an embodiment, as shown in FIG. 13, the second clock signal CLK2 may be set to a signal shifted by ¼ period from the first clock signal CLK1, for example. In addition, the third clock signal CLK3 may be set to a signal shifted by ¼ period from the second clock signal CLK2. Similarly, the fourth clock signal CLK4 may be set to a signal shifted by ¼ period from the third clock signal CLK3. Here, a high period of the clock signals CLK1 to CLK4 may partially overlap a high period of a previously supplied clock signal.

In this case, the scan signal output from the stages ST1 to STn may partially overlap a previous scan signal. In an embodiment, a high period of the second scan signal SS2 may partially overlap a high period of the first scan signal SS1, for example.

In an embodiment, the carry clock signals RCLK1 to RCLK4 may have a waveform in which a period is the same and a phase is shifted. The second carry clock signal RCLK2 may be set to a signal shifted by ¼ period from the first carry clock signal RCLK1. In addition, the third carry clock signal RCLK3 may be set to a signal shifted by ¼ period from the second carry clock signal RCLK2. Similarly, the fourth carry clock signal RCLK4 may be set to a signal shifted by ¼ period from the third carry clock signal RCLK3. Here, a high period of the carry clock signals RCLK1 to RCLK4 may partially overlap a high period of a previously supplied carry clock signal.

In this case, the carry signal output from the stages ST1 to STn may partially overlap a previous carry signal. In an embodiment, a high period of the second carry signal CR2 may partially overlap a high period of the first carry signal CR1, for example.

In an embodiment, the first clock signal CLK1 and the first carry clock signal RCLK1 may have the same cycle and the same phase as each other. In addition, the second clock signal CLK2 and the second carry clock signal RCLK2 may have the same period and the same phase as each other. In addition, the third clock signal CLK3 and the third carry clock signal RCLK3 may have the same period and the same phase as each other. In addition, the fourth clock signal CLK4 and the fourth carry clock signal RCLK4 may have the same period and the same phase.

Although the above has been described with reference to the embodiments of the disclosure, those skilled in the art will understand that the disclosure may be variously corrected and modified within the scope without departing from the spirit and scope of the disclosure described in the claims.

What is claimed is:

1. A stage circuit comprising:
an input unit connected to a first input terminal which receives a gate start pulse or a previous stage carry signal so that the input unit controls a voltage of a first node;
a first output unit which is connected to a fourth input terminal to which a clock signal is input and supplies a scan signal to a first output terminal corresponding to a voltage of the first node and a second node;
a second output unit which is connected to a third input terminal to which a second carry clock signal is input and supplies a carry signal to a second output terminal corresponding to the voltage of the first node and the second node;
a first control unit which is connected to a first power input terminal to which first power is input and controls a voltage of a third node;
a second control unit which is connected to a second power input terminal to which second power is input and controls the voltage of the third node; and
a first driving unit which controls an electrical connection between the second node and the first power input terminal in response to the voltage of the third node,
wherein the first driving unit cuts off the electrical connection between the second node and the first power input terminal when a voltage of the second power is supplied to the third node by the second control unit, and electrically connects the second node and the first power input terminal when a voltage of the first power is supplied to the third node.

2. The stage circuit according to claim 1, wherein the first driving unit includes an eleventh transistor connected between the first power input terminal and the second node, and including a gate electrode and a back-gate electrode connected to the third node.

3. The stage circuit according to claim 1, wherein the first control unit includes a tenth transistor connected between the first power input terminal and the third node, and including a gate electrode and a back-gate electrode connected to the first power input terminal.

4. The stage circuit according to claim 3, wherein the tenth transistor is configured by connecting a plurality of transistors in series.

5. The stage circuit according to claim 1, wherein the second control unit includes a twelfth transistor connected between the second power input terminal and the third node, and including a gate electrode and a back-gate electrode connected to the first node.

6. The stage circuit according to claim 1, further comprising:
a second driving unit which is connected to a third power input terminal to which third power is input and controls the voltage of the second node in response to the voltage of the first node;
a third driving unit which controls a voltage of the second output terminal in response to the voltage of the second node and the first node;
a reset unit which is connected to the first node, the third power input terminal, and a fifth input terminal to which a reset signal is input, and supplies a voltage of the third power to the first node when the reset signal is supplied to the fifth input terminal; and
a fourth driving unit which is connected to the input unit and the reset unit via the first power input terminal and a fourth node and controls a voltage of the fourth node in response to the voltage of the first node.

7. The stage circuit according to claim 6, wherein the input unit is connected to a second input terminal to which a first carry clock signal is input,
the input unit includes a (1-1)-th transistor and a (1-2)-th transistor connected in series between the first input terminal and the first node and including a gate electrode connected to the second input terminal, and a common node between the (1-1)-th transistor and the (1-2)-th transistor is connected to the fourth node.

8. The stage circuit according to claim 6, wherein the input unit includes a (1-1)-th transistor and a (1-2)-th transistor connected in series between the first input terminal and the first node and including a gate electrode connected to the first input terminal, and a common node between the (1-1)-th transistor and the (1-2)-th transistor is connected to the fourth node.

9. The stage circuit according to claim 6, wherein the second driving unit includes a thirteenth transistor connected between the second node and the third power input terminal, and including a gate electrode and a back-gate electrode connected to the first node.

10. The stage circuit according to claim 6, wherein the third driving unit includes a fifth transistor connected between the first node and the second output terminal, and including a gate electrode connected to the second node.

11. The stage circuit according to claim 10, wherein the third driving unit further includes a fourth transistor connected between the fifth transistor and the first node, and including a gate electrode connected to the third input terminal.

12. The stage circuit according to claim 6, wherein the fourth driving unit includes a plurality of third transistors connected in series between the first power input terminal and the fourth node, and including a gate electrode and a back-gate electrode connected to the first node.

13. The stage circuit according to claim 6, wherein the reset unit includes a (2-1)-th transistor and a (2-2)-th transistor connected in series between the first node and the third power input terminal, a gate electrode of the (2-1)-th transistor and the (2-2)-th transistor is connected to the fifth input terminal, and a common node between the (2-1)-th transistor and the (2-2)-th transistor is connected to the fourth node.

14. The stage circuit according to claim 13, wherein the (2-1)-th transistor and the (2-2)-th transistor further include a back-gate electrode, and the back-gate electrode is connected to the fifth input terminal.

15. The stage circuit according to claim 13, wherein the (2-2)-th transistor further includes a back-gate electrode, and the back-gate electrode is connected to the third power input terminal.

16. The stage circuit according to claim 6, further comprising:
a fifth driving unit which controls an electrical connection between the second node and the third power input terminal in response to a carry signal of a next stage circuit supplied to a second input terminal.

17. The stage circuit according to claim 16, wherein the fifth driving unit includes a (14-1)-th transistor and a (14-2)-th transistor connected between the second node and the third power input terminal and including a gate electrode connected to the second input terminal, and
a common node between the (14-1)-th transistor and the (14-2)-th transistor is connected to the fourth node.

18. The stage circuit according to claim 6, wherein the first power is set to a voltage value higher than a voltage level of the second power and a voltage level the third power, and
the second power and the third power are set to a same voltage value.

19. The stage circuit according to claim 6, wherein the first power is set to a voltage value higher than a voltage level of the second power and a voltage level the third power, and
the second power is set to the voltage value higher than the voltage level of the third power.

20. The stage circuit according to claim 6, wherein the second output unit comprises:
a sixth transistor connected between the third input terminal and the second output terminal, and including a gate electrode and a back-gate electrode connected to the first node; and
a seventh transistor connected between the second output terminal and the third power input terminal, and including a gate electrode connected to the second node.

21. The stage circuit according to claim 20, wherein the seventh transistor includes a back-gate electrode connected to the third power input terminal.

22. The stage circuit according to claim 1, further comprising:
a first capacitor connected between the first node and the second output terminal.

23. The stage circuit according to claim 1, further comprising:
a second capacitor connected between the second node and the third node.

24. The stage circuit according to claim 1, wherein the first output unit comprises:
an eighth transistor connected between the fourth input terminal and the first output terminal, and including a gate electrode and a back-gate electrode connected to the first node; and
a ninth transistor connected between the first output terminal and the second power input terminal, and including a gate electrode connected to the second node.

25. The stage circuit according to claim 24, wherein the ninth transistor includes a back-gate electrode connected to the second power input terminal.

* * * * *